US009006913B2

(12) United States Patent
Takita

(10) Patent No.: US 9,006,913 B2
(45) Date of Patent: Apr. 14, 2015

(54) COGENERATION APPARATUS

(75) Inventor: Yoshiharu Takita, Wako (JP)

(73) Assignee: Honda Motor Co., Ltd., Tokyo (JP)

(*) Notice: Subject to any disclaimer, the term of this patent is extended or adjusted under 35 U.S.C. 154(b) by 460 days.

(21) Appl. No.: 13/275,610

(22) Filed: Oct. 18, 2011

(65) Prior Publication Data

US 2012/0126536 A1 May 24, 2012

(30) Foreign Application Priority Data

Nov. 19, 2010 (JP) ................. 2010-259183

(51) Int. Cl.
*F02B 63/04* (2006.01)
*F01K 15/00* (2006.01)
*H05K 5/02* (2006.01)
*H02G 3/22* (2006.01)
*F24H 1/22* (2006.01)

(52) U.S. Cl.
CPC ............... *H05K 5/0247* (2013.01); *H02G 3/22* (2013.01); *Y02E 20/14* (2013.01); *F24H 2240/06* (2013.01); *F24H 1/22* (2013.01); *F02B 63/044* (2013.01); *Y02T 10/16* (2013.01)

(58) Field of Classification Search
CPC ......... H05K 5/0247; H02G 3/22; Y02E 20/14
USPC ........ D13/101, 112, 114, 118, 122, 123, 133, D13/152, 184, 199; 220/3.2, 4.01; 285/125.1; 403/169; 123/2, 3; 60/618; 290/2, 1 A
See application file for complete search history.

(56) References Cited

U.S. PATENT DOCUMENTS

| | | | | |
|---|---|---|---|---|
| 4,092,034 A * | 5/1978 | Becker | ........................ | 280/420 |
| 4,835,405 A * | 5/1989 | Clancey et al. | ............... | 290/1 A |
| 5,433,175 A * | 7/1995 | Hughes et al. | ..................... | 123/2 |
| 5,590,806 A * | 1/1997 | Green et al. | .................. | 220/562 |
| 5,734,776 A * | 3/1998 | Puetz | ............................ | 385/134 |
| 5,947,765 A * | 9/1999 | Carlson et al. | ................ | 439/535 |
| 6,146,192 A * | 11/2000 | Cabalka et al. | ............ | 439/540.1 |
| 2003/0129871 A1* | 7/2003 | Follingstad | ................... | 439/534 |
| 2005/0142910 A1* | 6/2005 | Levesque et al. | ............ | 439/120 |
| 2005/0142932 A1* | 6/2005 | Levesque et al. | ........... | 439/540.1 |
| 2006/0154513 A1* | 7/2006 | Barker et al. | ................. | 439/450 |

FOREIGN PATENT DOCUMENTS

JP 2006-121888 A 5/2006
JP 2007-013929 A 1/2007

OTHER PUBLICATIONS

Japanese Office Action dated Oct. 22, 2013, issued in corresponding Japanese Patent Application No. 2010-259183, w/ English translation.

* cited by examiner

*Primary Examiner* — Julio C. Gonzalez
(74) *Attorney, Agent, or Firm* — Westerman, Hattori, Daniels & Adrian, LLP

(57) ABSTRACT

A cogeneration apparatus includes an electrical generator, an engine for driving the generator, and a heat exchanger for using waste heat of the engine as a heat source, which are housed in a housing. The apparatus is provided with an internal fuel line for supplying fuel to the engine from outside, and power wiring for supplying electrical power generated by the electrical generator to the outside. The housing has a substantially V-shaped lead-out part capable of leading the fuel line and the wiring to outside of the housing.

8 Claims, 18 Drawing Sheets

COGENERATION APPARATUS

FIELD OF THE INVENTION

The present invention relates to a cogeneration apparatus wherein fuel is supplied to a motor from outside via a fuel line, an electrical generator is driven by the motor to generate electrical power, and the electrical power generated by the electrical power is supplied via power wiring to the outside.

BACKGROUND. OF THE INVENTION

Among cogeneration apparatuses are those that accommodate a motor (gas engine), an electrical generator, a heat exchanger, and the like in a housing. According to such a cogeneration apparatus, the gas engine is used to drive the electrical generator and generate electrical power, the waste heat (exhaust heat) of the gas engine is used to generate hot water via a heat exchanger, and the heat of the water is used for air-warming applications or other purposes.

A well-known example of a cogeneration apparatus is disclosed in Japanese Patent Application Laid-Open Publication No. 2007-13929 (JP-A 2007-13929), in which a fuel line, a water-supply line, a hot-water line, power wiring, and the like are led substantially vertically from a housing and positioned, e.g., along an outside wall of a house.

The fuel line supplies fuel gas from outside to a gas engine within the housing, and the water-supply line supplies water to a heat exchanger. The hot-water line leads hot water generated by the heat exchanger to the outside, and the power wiring supplies electrical power generated by an electrical generator to the outside.

The minimum bend radius for the lines and wiring that are led from the housing to the outside is fixed. Therefore, in order for the lines and the wiring, which are led substantially vertically from the housing to the outside, to be positioned, e.g., along an outside wall of a house, the cogeneration apparatus must be disposed fairly distantly from the outside wall of the house.

SUMMARY OF THE INVENTION

It is an object of the present invention to provide a cogeneration apparatus that can be disposed near an outside wall of a house or the like.

According to an aspect of the present invention, there is provided a cogeneration apparatus which comprises: a motor; an electrical generator driven by the motor; a heat exchanger for using waste heat of the motor as a heat source; a housing for housing the motor, the electrical generator, and the heat exchanger; a fuel line for supplying fuel to the motor from outside; and wiring for connecting devices within the housing to outside the housing so that electrical power generated by the electrical generator is supplied to the outside, wherein the housing has a substantially V-shaped lead-out part whereby one selected from among the fuel line and the wiring is led to the outside of the housing.

In the present invention, the housing has a substantially V-shaped lead-out part, where a selection from the fuel line and the wiring can be led from the lead-out part to the outside of the housing. Forming the lead-out part in a V-shape allows the lead-out part to be inclined with respect to a wall surface of the housing. The fuel line and the wiring are therefore led from the lead-out part to outside the housing, whereby the fuel line and the wiring can be positioned in an inclined state with respect to the housing. Positioning the fuel line and the wiring in an inclined state with respect to the housing allows the fuel line and the wiring to be positioned near the housing. The degree of freedom in placing the cogeneration apparatus can thereby be increased, and the cogeneration apparatus can therefore be disposed near an outer wall of a house or the like.

The lead-out part is preferably formed in a shape that is convex towards an interior of the housing with respect to a wall surface of the housing. Forming the V-shaped lead-out part in a shape that is convex toward the interior of the housing allows the lead-out part to be depressed toward the inside with respect to the wall surface of the housing, and allows the fuel line and the wiring to be positioned even closer to the housing. The degree of freedom in placing the cogeneration apparatus can thereby be further increased.

Preferably, the lead-out part is formed substantially in a V-shape when the housing is viewed from above. The fuel line and the wiring can therefore be positioned inclining to the left or right with respect to the wall surface of the housing.

Desirably, the lead-out part is formed substantially in a V-shape when the housing is viewed laterally. The fuel line and the wiring can therefore be positioned inclining up or down with respect to the wall surface of the housing.

In a preferred form, the lead-out part has a first lead-out part formed substantially in a V-shape when the housing is viewed from above; and a second lead-out part formed substantially in a V-shape when the housing is viewed laterally. By virtue of the lead-out part having the first lead-out part and the second lead-out part, the fuel line and the wiring can thus be positioned in a state of being inclined to the left or right or a state of being inclined up or down with respect to the wall surface of the housing. The directions in which the fuel line and the wiring are positioned can thereby be freely selected according to the placement conditions of the cogeneration apparatus, and therefore the degree of freedom in placing the cogeneration apparatus can be further increased.

Preferably, a selection is made between the lead-out part being in a state formed substantially in a V-shape when the housing is viewed from above; and in a state formed substantially in a V-shape when the housing is viewed laterally. A selection can therefore be made between the fuel line and the wiring being positioned inclining to the left or right with respect to the wall surface of the housing, and the fuel line and the wiring being positioned inclining to up or down with respect to the wall surface of the housing. The directions in which the fuel line and the wiring are positioned can thereby be freely selected according to the placement conditions of the cogeneration apparatus, and therefore the degree of freedom in placing the cogeneration apparatus can be further increased.

BRIEF DESCRIPTION OF THE DRAWINGS

Certain preferred embodiments of the present invention will be described in detail below, by way of example only, with reference to the accompanying drawings, in which.

DETAILED DESCRIPTION OF THE PREFERRED EMBODIMENTS

Figure 1:
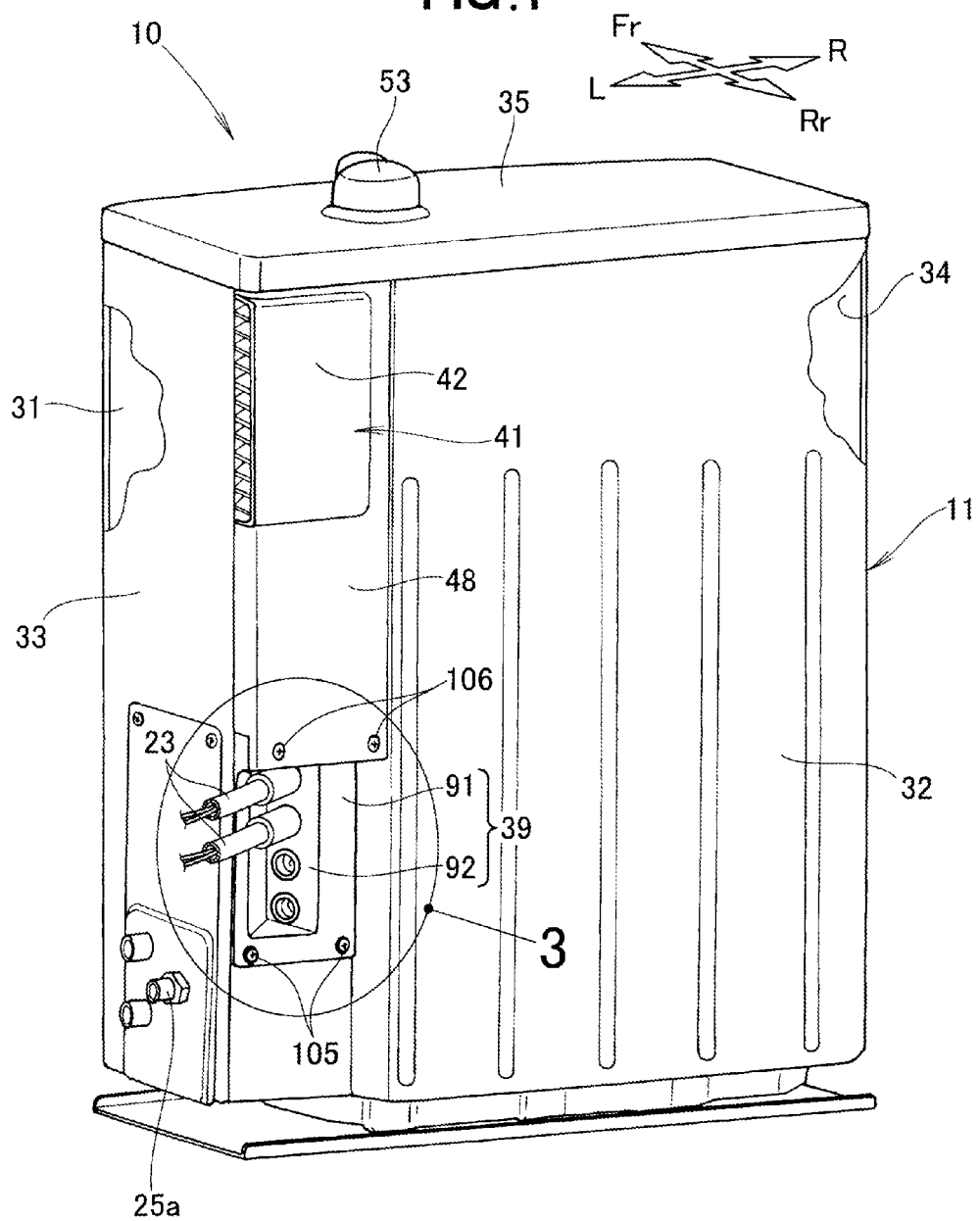
FIG. 1 is a perspective view showing a cogeneration apparatus, as seen from the rear, according to a first embodiment of the present invention.

In the description of embodiments according to the present invention, "Fr," "Rr," "L," and "R" shown in the drawings represent "front," "rear," "left," and "right."

Embodiment 1

Figure 2:
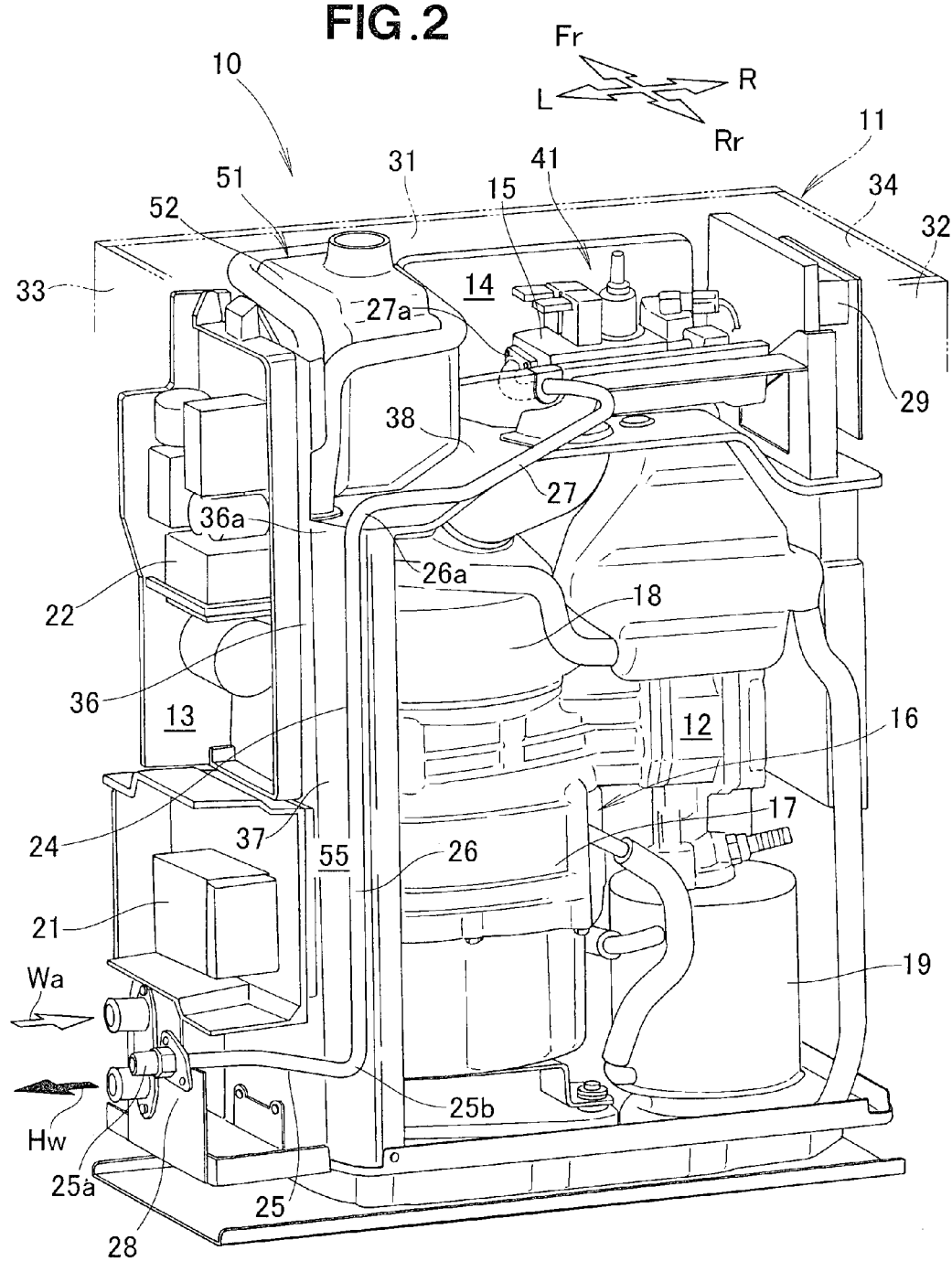
FIG. 2 is a perspective view showing the cogeneration apparatus of FIG. 1, with an outside panel removed.

As shown in FIGS. 1 and 2, a cogeneration system 10 according to Embodiment 1 is a combined heat-and-power apparatus that is provided with a cogeneration case (housing) 11 partitioned into a power-generation compartment 12 and an electrical-equipment compartment 13; an engine (motor) 16 accommodated in a lower part inside the power-generation compartment 12; an electrical generator 18 provided to an upper part of a body (referred to as "engine body" below) 17 of the engine 16; a heat exchanger 19 provided to the side of the engine body 17; a first control part 21 accommodated in a lower part inside the electrical-equipment compartment 13; a power converter part 22 accommodated in an upper part inside the electrical-equipment compartment 13; and internal fuel line 24 accommodated within the electrical-equipment compartment 13.

The cogeneration apparatus 10 is provided with a power-wiring unit (wiring) 23 for supplying electrical power generated by the electrical generator 18 to the outside through the power converter part 22. The power-wiring unit 23 is supported by a lead-out part 39 of the cogeneration case 11.

The power-wiring unit 23 is given as an example of wiring in Embodiment 1, but the wiring is not limited to the power-wiring unit 23. Examples of wiring other than the power-wiring unit 23 include control lines for controlling the engine 16 and the like, signal lines for conveying signals to the devices within the cogeneration case 11, and communications lines for allowing communication between the devices within the cogeneration case 11.

The cogeneration case 11 is formed into a substantially rectangular shape by a front panel 31, a rear panel 32, a left side panel 33, a right side panel 34, and a roof panel 35. A dividing wall 36 is provided toward and along the left side panel 33 within the cogeneration case 11. An upper dividing part 38 is provided to extend from an upper end part 36a of the dividing wall 36 to the right side panel 34.

Providing the dividing wall 36 within the cogeneration case 11 allows the space within the cogeneration case 11 to be partitioned into left and right spaces for the power-generation compartment 12 and the electrical-equipment compartment 13. The power-generation compartment 12 on the right accommodates the engine 16, the electrical generator 18, the heat exchanger 19, and the like. The electrical-equipment compartment 13 on the left accommodates the first control part 21, the power converter part (inverter unit) 22, the internal fuel line 24, and the like.

Providing the upper dividing part 38 within the cogeneration case 11 allows the upper region of the power-generation compartment 12 to be partitioned into spaces for an intake/exhaust part 14. The intake/exhaust gas part 14 accommodates an air-cleaning device, a gas-flow-adjusting device 15, and a mixer (including a throttle valve). The air-cleaning device constitutes a part of an intake system 41 of the engine 16. The intake/exhaust part 14 also accommodates a muffler 52 that constitutes a part of an exhaust system 51 of the engine 16. The muffler 52 is communicatingly connected to an exhaust outlet 53.

The dividing wall 36 has a rear bent part 37 that is bent towards empty space ("dead space") in the power-generation compartment 12. The bent part 37 is provided to the rear end of the dividing wall 36 and is provided adjoining the rear panel (wall surface) 32. A concave part 55 is formed by the bent part 37 and the rear panel 32. In other words, the concave part 55 is a space adjoining the rear panel 32 and is formed by the bent part 37 and the rear panel 32 in a substantially triangular shape when viewed from above.

The concave part 55 that is depressed from the electrical-equipment compartment 13 toward the power-generation compartment 12 is thus formed in the electrical-equipment compartment 13 using the empty space of the cogeneration case 11, or, specifically, using the empty space of the power-generation compartment 12. The internal fuel line 24 is disposed within the concave part 55.

Thus, the cogeneration case 11 is partitioned into the power-generation compartment 12 and the electrical-equipment compartment 13, the concave part 55 is formed to be depressed from the electrical-equipment compartment 13 toward the power-generation compartment 12, and the internal fuel line 24 is disposed in the concave part 55. The internal fuel line 24 can thereby be disposed in the electrical-equipment compartment 13, and therefore the heat produced by the engine 16 does not affect the fuel gas (fuel) flowing within the internal fuel line 24.

The empty space ("dead space") of the cogeneration case 11 is used to form the concave part 55, whereby more space need not be secured for forming the concave part 55 in the cogeneration case 11. The cogeneration case 11 can thereby be limited to a small size, and the cogeneration apparatus 10 can be downsized.

The concave part 55 is provided adjoining the rear panel 32 of the cogeneration case 11 and is formed having a substantially triangular shape when viewed from above. One side of the substantially triangular concave part 55 can therefore double (be formed as) a part of the rear panel 32, and the other sides can be formed by the dividing wall 36 (specifically, the bent part 37) of the electrical-equipment compartment 13. The dividing wall 36 of the electrical-equipment compartment 13 that forms the substantially triangular concave part 55 can therefore be limited to a small size.

The other sides of the substantially triangular concave part 55 can be formed using a simple configuration in which the bent part 37 of the dividing wall 36 is merely bent at one location. The bent part 37 of the dividing wall 36 that forms the substantially triangular concave part 55 can thus be limited to a small size. The simple configuration in which the bent part 37 of the dividing wall 36 is merely bent at one location also allows the cost of the cogeneration apparatus 10 to be reduced.

A left-end lower part 32a (see FIG. 3) of the rear panel 32 of the cogeneration case 11 is provided with the lead-out part 39. The lead-out part 39 is formed substantially as a V-shape and functions to allow the power-wiring unit 23 to be led to the outside of the cogeneration case 11.

The engine 16 is a gas engine that is provided with an air-intake part 42 provided to the intake system 41; the air-cleaning device provided downstream of the air-intake part 42; the gas-flow-adjusting device 15 provided downstream of the air-cleaning device, the mixer provided downstream of the gas-flow-adjusting device 15; and the throttle valve included in the mixer.

According to the intake system 41, air (outside air) taken in from the air-intake part 42 is led to the air-cleaning device. The air that is led to the air-cleaning device is purified by the air-cleaning device, and purified air is mixed with the fuel gas in the mixer. The mixed fuel gas is introduced through the throttle valve into the combustion chamber of the engine 16, and the engine 16 is driven.

The electrical generator 18 is provided to the upper part of the engine body 17, and a drive shaft of the electrical generator 18 is coaxially linked to a crankshaft of the engine 16. Driving the electrical generator 18 using the engine 16 causes electrical power (alternating-current electrical power) to be generated by the electrical generator 18.

In the heat exchanger 19, water is brought in from the outside as shown by the arrow Wa, along with exhaust gas of the engine 16. Heat exchange occurs between the exhaust gas and the water, thereby heating the water. The waste heat (exhaust heat) of the engine 16 is thus used as a heat source to generate hot water, and the heat of the hot water generated is brought to the outside of the cogeneration apparatus 10 as shown by the arrow Hw and used for air-warming applications or other purposes.

The first control part 21 is provided to substantially the lower-half part of the dividing wall 36 and is thereby disposed in the electrical-equipment compartment 13. The first control part 21 is, e.g., an earth leakage circuit breaker, but this example is not given by way of limitation; other engine-controlling functions may be provided.

The cogeneration apparatus 10 is provided with a second control part 29 on the right of the intake/exhaust part 14. The second control part 29 is an ECU provided with functions for, e.g., controlling the engine 16 so that the electrical generator 18 is switched to a starter function when starting the engine 16, and the electrical generator 18 is switched to the generator function after starting the engine 16. As long as the second control part 29 is not disposed in the power-generation compartment 12, the space in which the second control part is placed is not limited, and the second control part may therefore also be disposed in the electrical-equipment compartment 13.

The power converter part 22 is provided to the upper-half part of the dividing wall 36 and is thereby disposed in the electrical-equipment compartment 13. The power converter part 22 is an inverter unit for converting the alternating-current electrical power produced by the electrical generator 18 into electrical power of the required specifications.

In the internal fuel line 24, a panel end part 25a is provided to a supporting bracket 28 near the left side panel 33, and a gas-flow-adjusting end part 27a is provided to the gas-flow-adjusting device 15. The panel end part 25a is on the upstream side of the internal fuel line 24, and the gas-flow-adjusting end part 27a is on the downstream of the internal fuel line 24. The internal fuel line 24 has a lower horizontal line part 25 and a vertical line part 26 accommodated in the electrical-equipment compartment 13; and an upper inclined line part 27 accommodated in the intake/exhaust part 14.

The panel end part 25a is provided to the left side panel 33, and the lower horizontal line part 25 extends substantially horizontally from the panel end part 25a to the bent part 37. The lower horizontal line part 25 is accommodated in the electrical-equipment compartment 13. The panel end part 25a is communicatingly connected through an external fuel line to a fuel-gas supply source outside the cogeneration apparatus 10.

The vertical line part 26 extends from a bent-part end 25b of the lower horizontal line part 25 upwards along the bent part 37 to the upper dividing part 38. The vertical line part 26 is accommodated in the electrical-equipment compartment 13 (specifically, in the concave part 55).

The upper inclined line part 27 extends from an upper end 26a of the vertical line part 26 to the gas-flow-adjusting device 15. The gas-flow-adjusting end part 27a is communicatingly connected with the gas-flow-adjusting device 15. The upper inclined line part 27, which is communicatingly connected with the gas-flow-adjusting device 15, is accommodated in the intake/exhaust part 14.

The upper inclined line part 27 is thus communicatingly connected to the gas-flow-adjusting device 15, whereby the gas-flow-adjusting device 15 is communicatingly connected to the fuel-gas supply source via the internal fuel line 24 and the external fuel line. The fuel gas (fuel) of the fuel-gas supply source can therefore be supplied through the external fuel line and the internal fuel line 24 to the gas-flow-adjusting device 15. The flow rate of the fuel gas that is supplied to the gas-flow-adjusting device 15 is adjusted by the gas-flow-adjusting device 15, and the fuel gas is, led to the mixer. The fuel gas that is led to the mixer is mixed with air led from the air-cleaning device. The fuel gas mixed in the mixer is introduced through the throttle valve into the combustion chamber of the engine 16.

Figure 3:
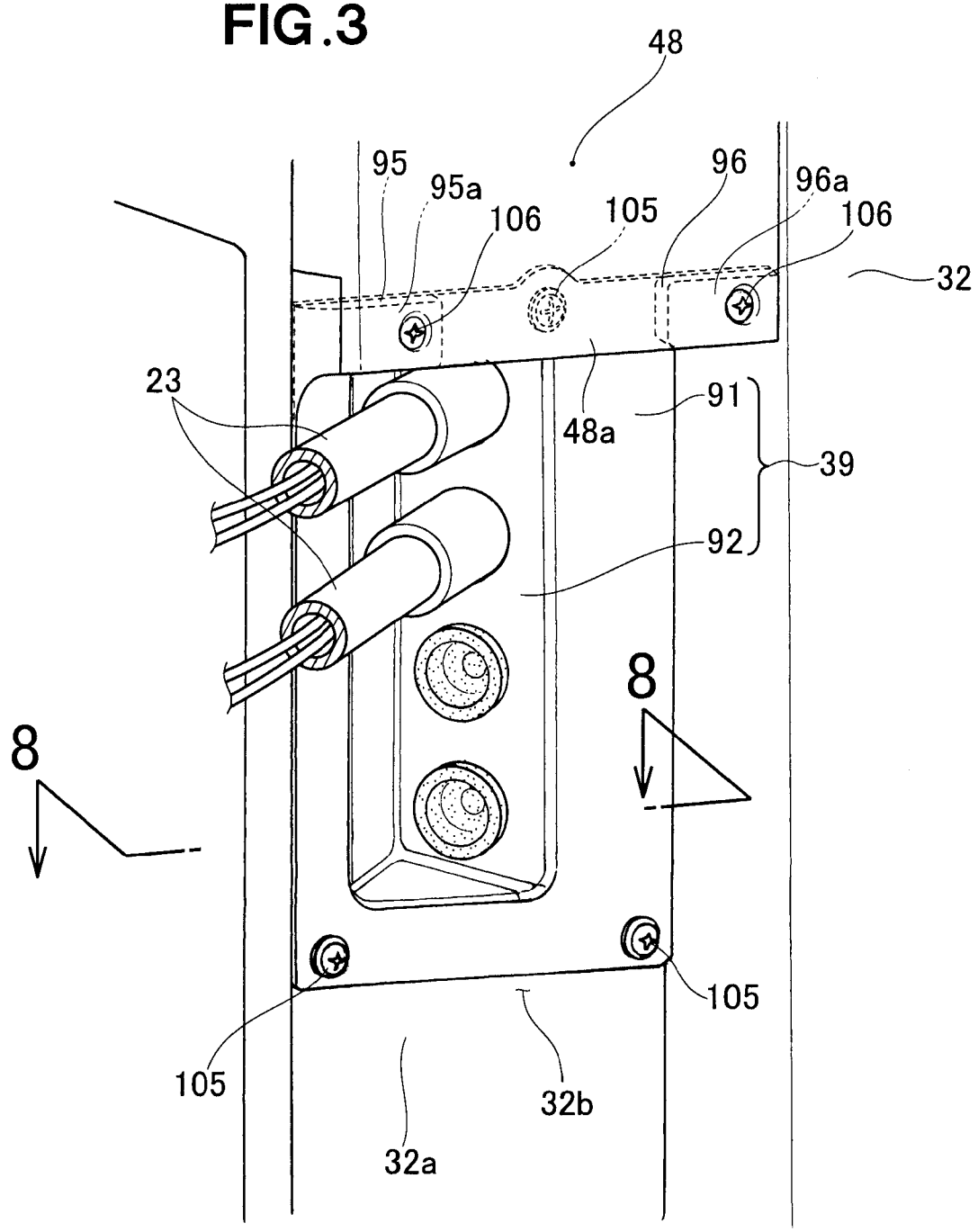
FIG. 3 is an enlarged view of region 3 of FIG. 1.
Figure 4:
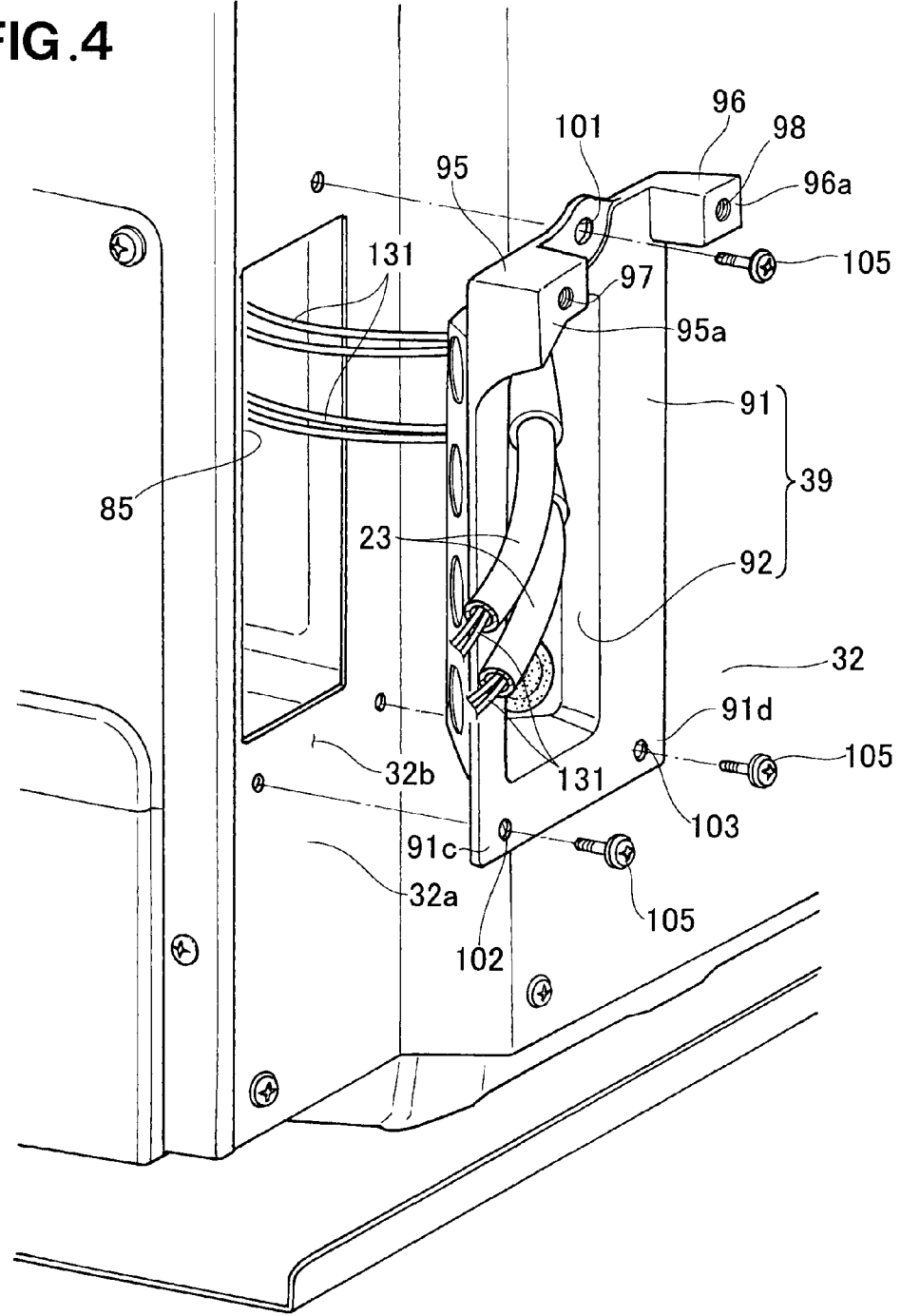
FIG. 4 is an exploded perspective view showing a cogeneration case according to the first embodiment, with a lead-out part removed.

The lead-out part 39 is attached to an attachment aperture part 85 of the rear panel 32, as shown in FIGS. 3 and 4. The attachment aperture part 85 is formed on the left-end lower part 32a of the rear panel 32. The lead-out part 39 has an external frame part 91 that is formed in a substantially rectangular shape, and an inclined lead-out part 92 that is formed integrally inside the external frame part 91.

Figure 5:
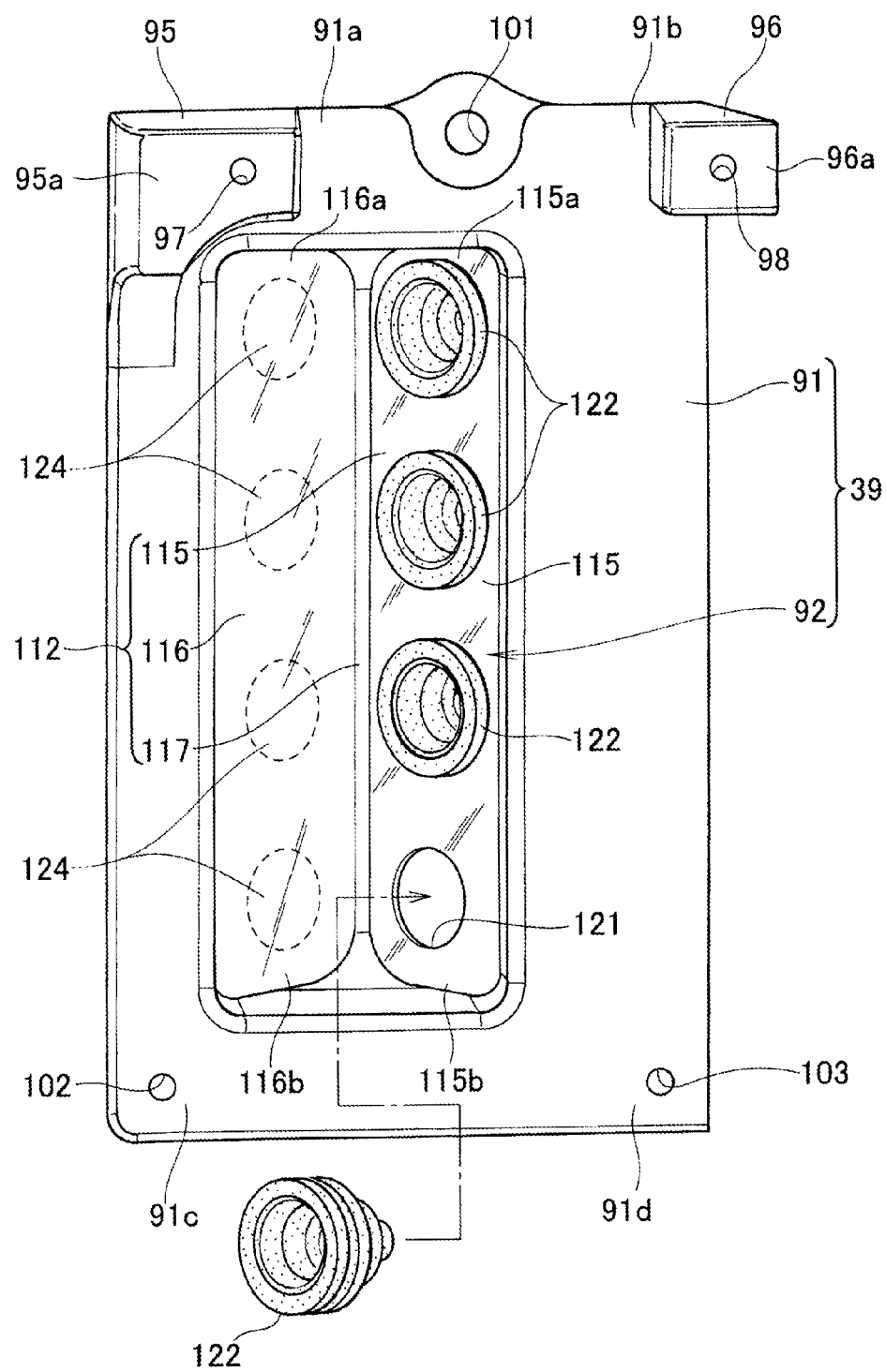
FIG. 5 is a front elevational view of the lead-out part of FIG. 4.

The external frame part 91 is a panel-shaped frame region that is formed so as to be able to contact a front surface 32b of the left-end lower part 32a in a state in which the inclined lead-out part 92 is fitted into the attachment aperture part 85. As shown in FIG. 5, on the external frame part 91, a left support region 95 is formed on an upper left corner region 91a, and a right support region 96 is formed on an upper right corner region 91b.

The left support region 95 bulges from the upper left corner region 91a toward the outside of the rear panel 32. A left screw hole 97 is formed on a left receiving region 95a of the left support region 95. The right support region 96 bulges from the upper right corner region 91b toward the outside of the rear panel 32. A right screw hole 98 is formed on a right receiving region 96a.

In the external frame part 91, an upper attachment hole 101 is formed between the left and right support regions 95, 96, a lower-left attachment hole 102 is formed on a lower-left corner region 91c, and a lower-right attachment hole 103 is formed on a lower-right corner region 91d.

Figure 8:
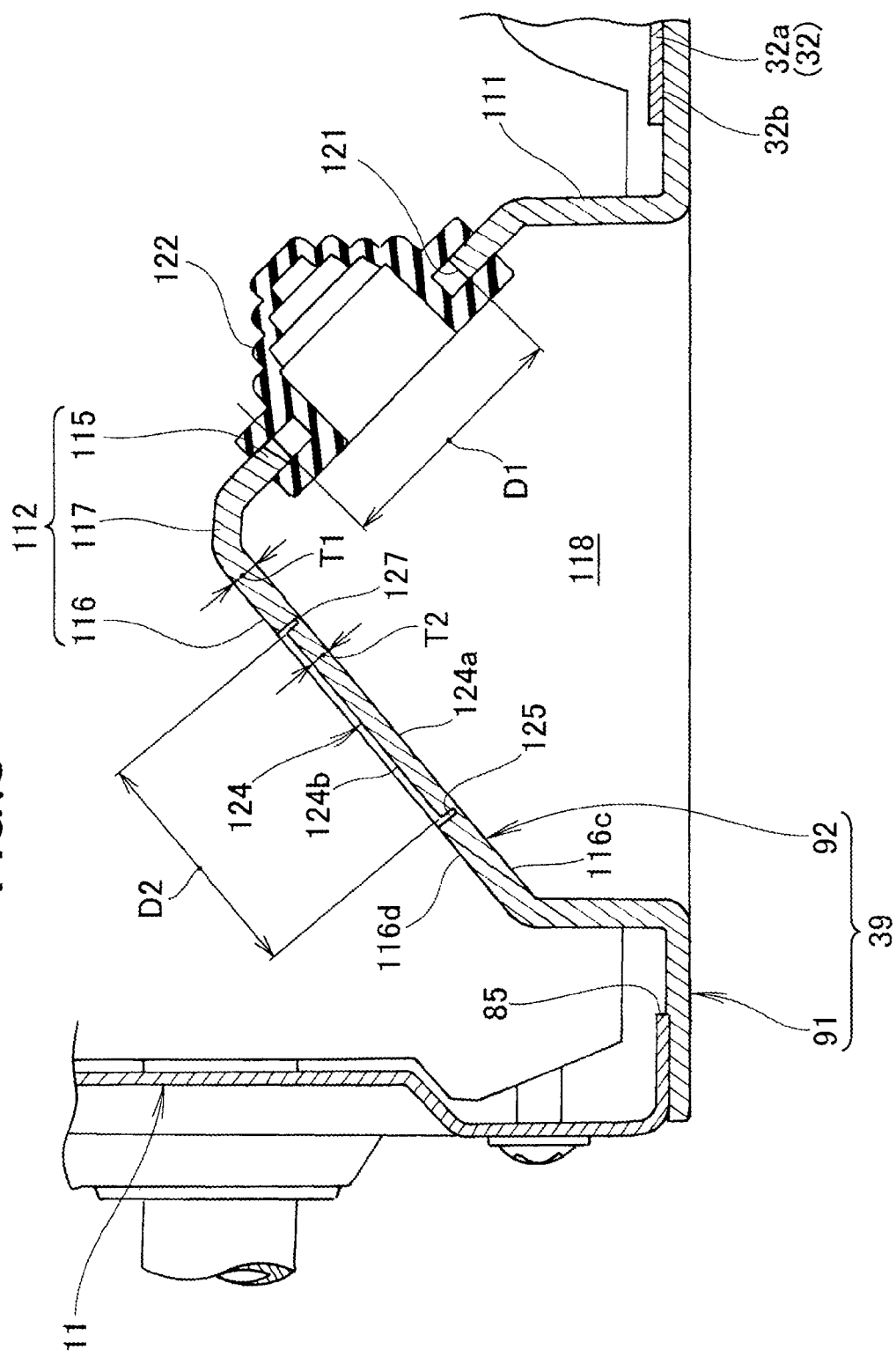
FIG. 8 is a cross-sectional view taken along line 8-8 of FIG. 3.

As shown in FIG. 4, the inclined lead-out part 92 is fit to the attachment aperture part 85, and the external frame part 91 is made to contact the front surface 32b of the rear panel 32 (see FIG. 8). In this state, screws 105 are inserted into the upper attachment hole 101, the lower-left attachment hole 102, and the lower-right attachment hole 103, and the inserted screws 105 are threadably joined to the rear panel 32 (the left-end lower part 32a). The external frame part 91 (i.e., the lead-out part 39) is thereby attached to the left-end lower part 32a by the screws 105.

The left support region 95 and the right support region 96 bulge from the front surface 32b of the rear panel 32 toward the outside in this state. An intake cover 48 is provided to the left receiving region 95a of the left support region 95 and the right receiving region 96a of the right support region 96, as shown in FIG. 3. Specifically, a lower-end part 48a of the intake cover 48 is attached to the left receiving region 95a and the right receiving region 96a by a screw 106 that is threadably joined to the left screw hole 97 (FIG. 4) of the left receiving region 95a and by the screw 106 that is threadably joined to the right screw hole 98 (FIG. 4) of the right receiving region 96a.

Figure 6:
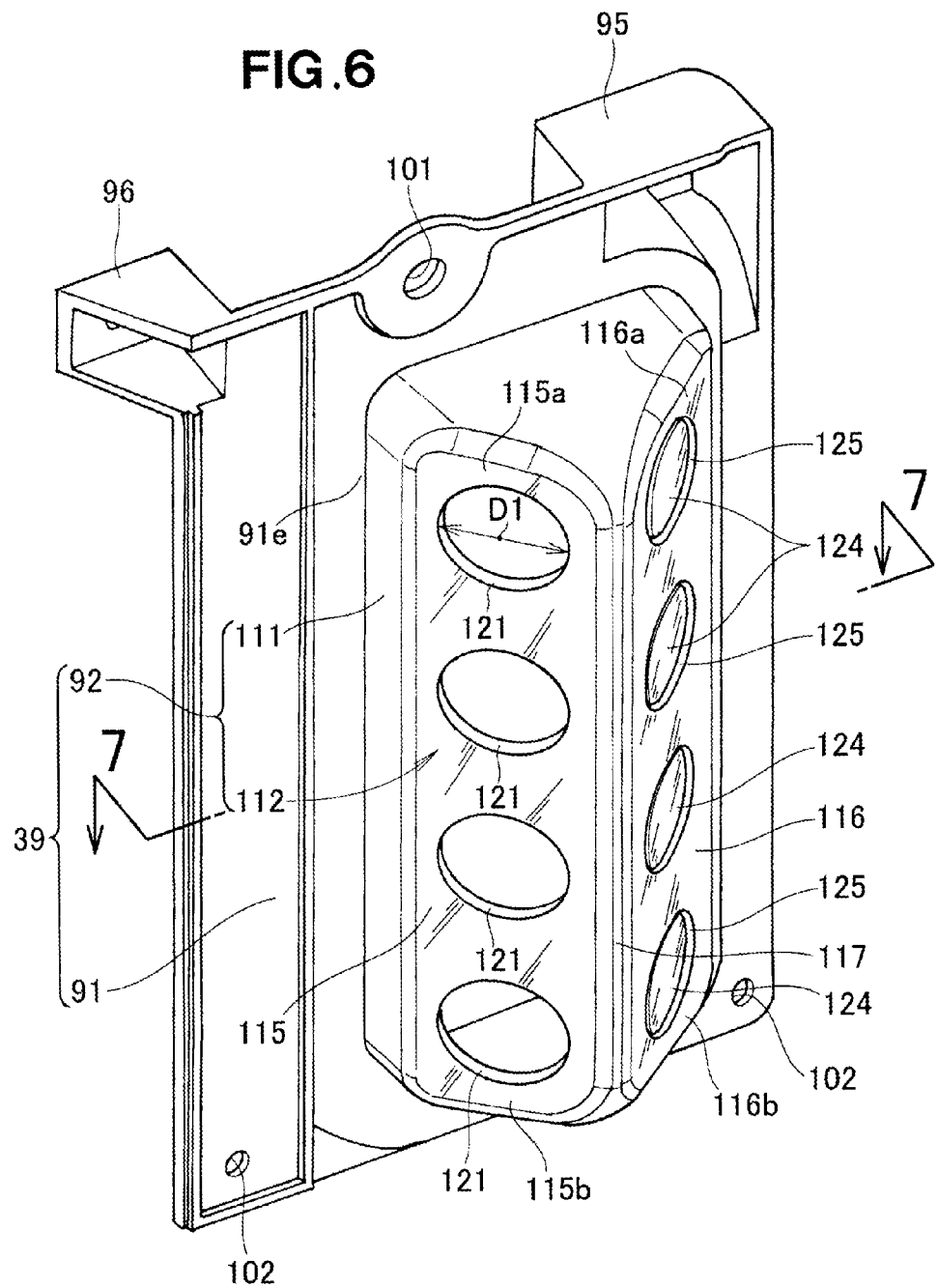
FIG. 6 is a perspective view showing the lead-out part of FIG. 4, as seen from inside the cogeneration case.
Figure 7:
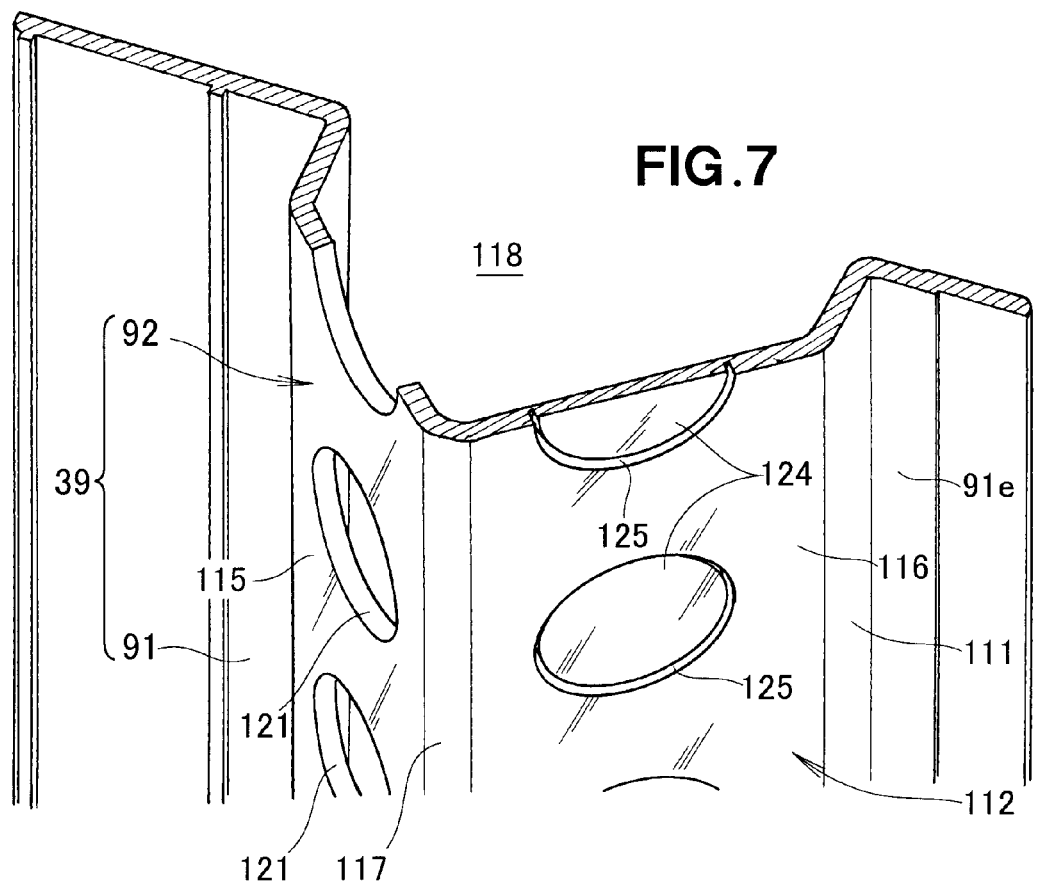
FIG. 7 is a cross-sectional view taken along line 7-7 of FIG. 6.

The inclined lead-out part 92 is integrally formed within the external frame part 91, as shown in FIGS. 6 and 7. The inclined lead-out part 92 has a perimeter wall region 111, which stretches from an inner perimeter edge 91e of the external frame part 91 toward the inside of the cogeneration case 11 (FIG. 1), and a substantially V-shaped inclined region 112, which is provided to the perimeter wall region 111.

The outer perimeter of the substantially rectangular perimeter wall region 111 is formed small all the way around so as to be capable of fitting to the attachment aperture part 85 (FIG. 4). The inclined region 112 has an inclined wall 115 on one side ("first inclined wall" below), an inclined wall 116 on the other side ("second inclined wall" below), and a bent part 117 for linking the first inclined wall 115 and the second inclined wall 116. The first inclined wall 115 and the second inclined wall 116 are bent at the bent part 117. A depressed space 118 is therefore formed within the inclined region 112.

As shown in FIG. 8, the inclined region 112 is formed substantially in a V-shape so as to protrude toward the inside of the cogeneration case 11 when viewing the cogeneration case 11 from above. In other words, the inclined region 112 is formed in a shape that is concave towards the inside of the cogeneration case 11 with respect to the rear panel 32.

As shown in FIGS. 5 and 6, the first inclined wall 115 has a plurality (four) of lead-out holes 121 that is formed in a substantially rectangular shape and are opened between an upper end part 115a and a lower end part 115b. Grommets 122 are detachably provided to the lead-out holes 121, whereby the lead-out holes 121 are blocked by the grommets 122. Removing the grommets 122 from the lead-out holes 121 opens the lead-out holes 121.

The plurality of the lead-out holes 121 is thus provided to the first inclined wall 115, and the lead-out holes 121 are plugged by the grommets 122, whereby the desired lead-out hole 121 can be selected from the plurality of the lead-out holes 121, and the power-wiring unit 23 can be led out. The usability of the lead-out part 39 can therefore be improved. The lead-out holes 121 are formed having a diameter D1.

The second inclined wall 116 is formed in a substantially rectangular shape, like the first inclined wall 115. On the second inclined wall 116, a plurality (four) of blocking pieces 124 is provided between an upper-end part 116a and a lower-end part 116b, and annular grooves 125 are formed between the blocking pieces 124 and the second inclined wall 116.

As shown in FIGS. 7 and 8, the blocking pieces 124 are formed as circles having an outside diameter D2. Front surfaces 124a are formed in a coplanar fashion with a front surface 116c of the second inclined wall 116, and rear surfaces 124b are formed in a depressed state with respect to a rear surface 116d of the second inclined wall 116. A thickness T2 of the blocking pieces 124 is therefore formed to be smaller than a thickness T1 of the second inclined wall 116. Reducing the thickness T2 of the blocking pieces 124 allows the amount of resin used when forming the lead-out part 39 to be reduced, and therefore costs can be reduced.

Forming the annular grooves 125 between the blocking pieces 124 and the second inclined wall 116 allows a break region 127 to be formed between bottom parts of the annular grooves 125 and the front surface 116c of the second inclined wall 116. The thickness of the break region 127 is less than the thickness T2 of the blocking pieces 124.

Figure 9:
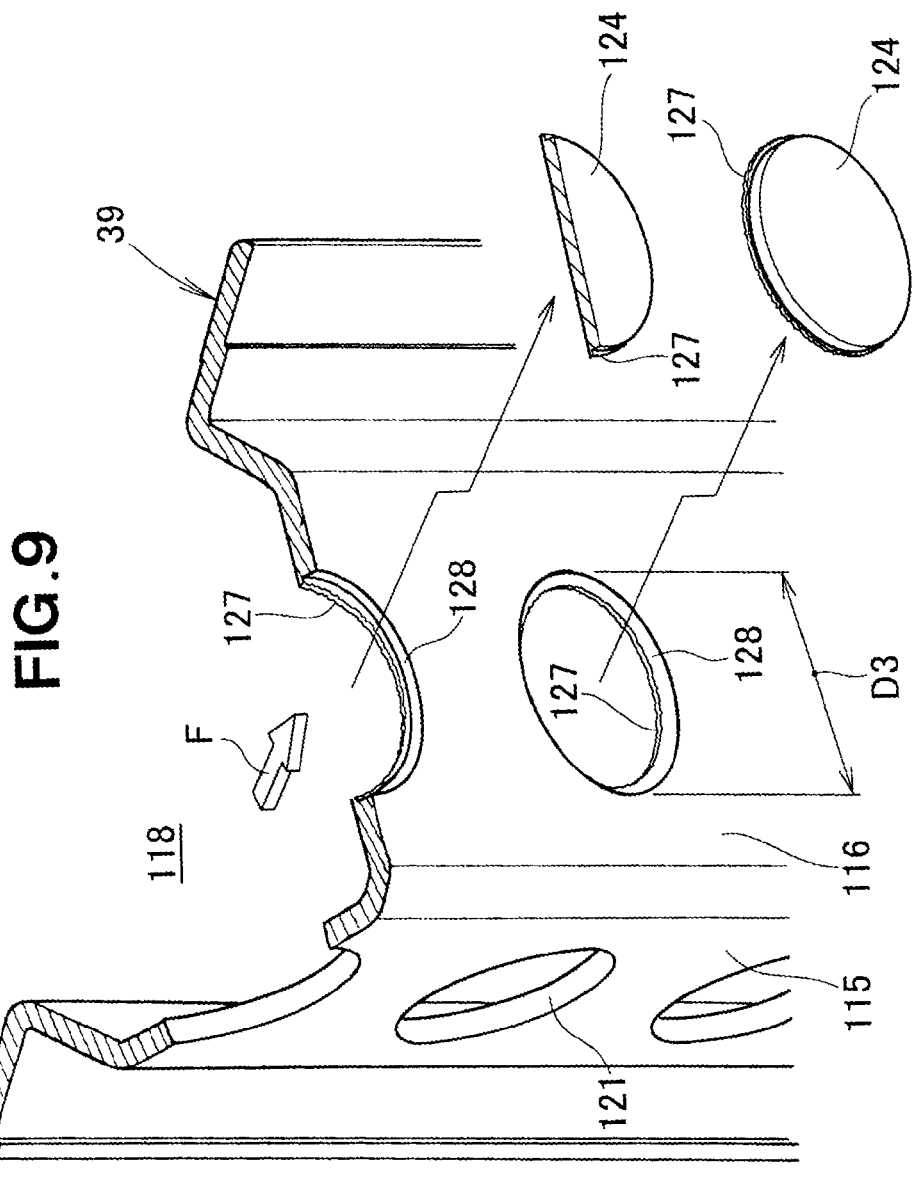
FIG. 9 is perspective view showing the lead-out part of FIG. 6, with a locking piece removed.

Causing a load F to act on the blocking pieces 124 from the depressed space 118 as shown in FIG. 9 allows the break region 127 to be broken and allows the blocking pieces 124 to be removed from the second inclined wall 116. Removing the blocking pieces 124 from the second inclined wall 116 allows lead-out holes 128 to be opened in the second inclined wall 116. The lead-out holes 128 are through-holes having a diameter D3.

The plurality of the blocking pieces 124 is thus provided to the second inclined wall 116, and removing the plurality of the blocking pieces 124 and opening the lead-out holes 128 allows the desired blocking piece 124 to be selected from the plurality of the blocking pieces 124, and allows the lead-out hole 128 to be opened. The opened lead-out hole 128 can be used to lead out the power-wiring unit 23. The usability of the lead-out part 39 can therefore be improved.

Figure 10:
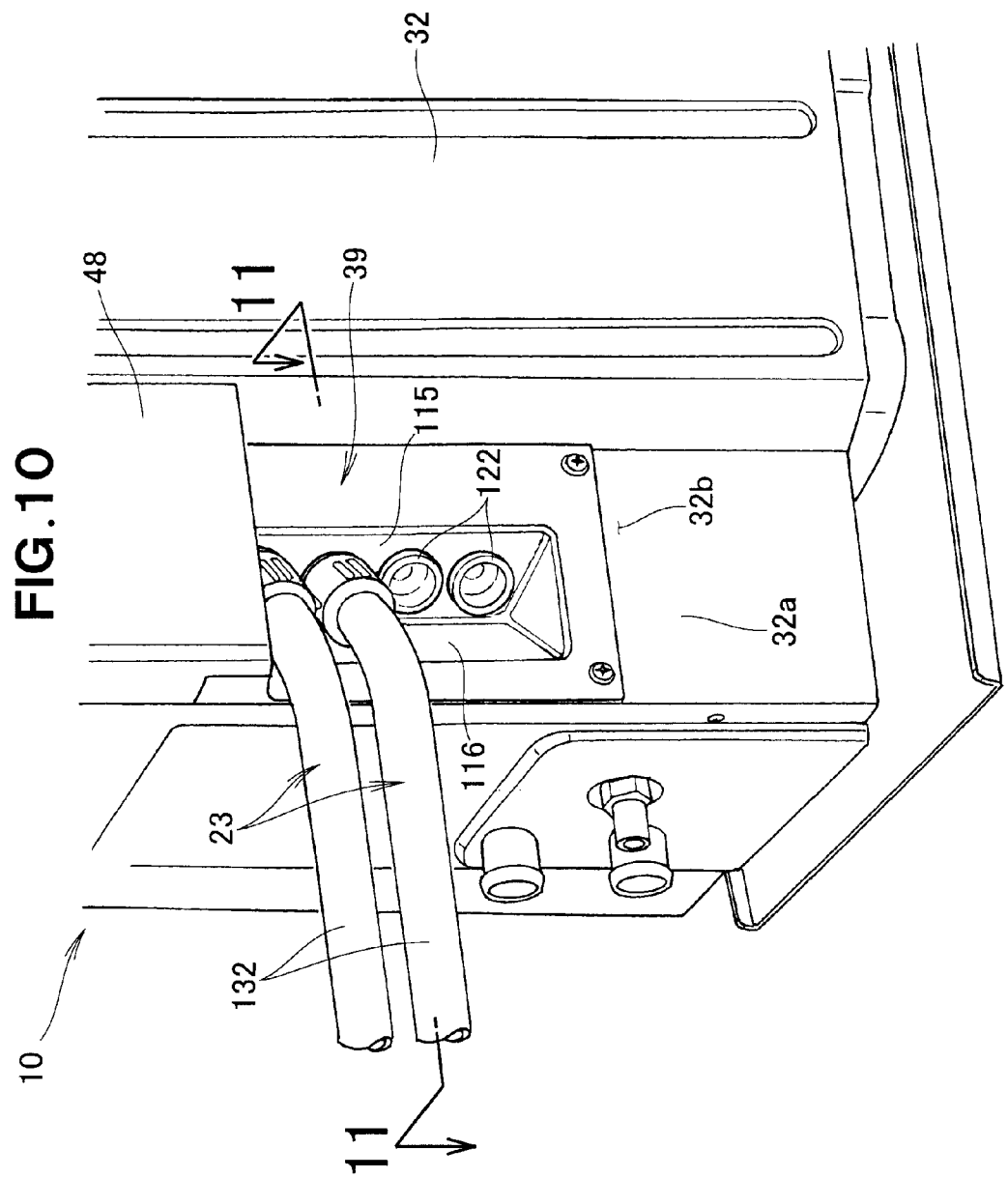
FIG. 10 is a perspective view showing the lead-out part, of FIG. 6, with a power-wiring unit attached to a first inclined wall of the lead-out part.
Figure 11:
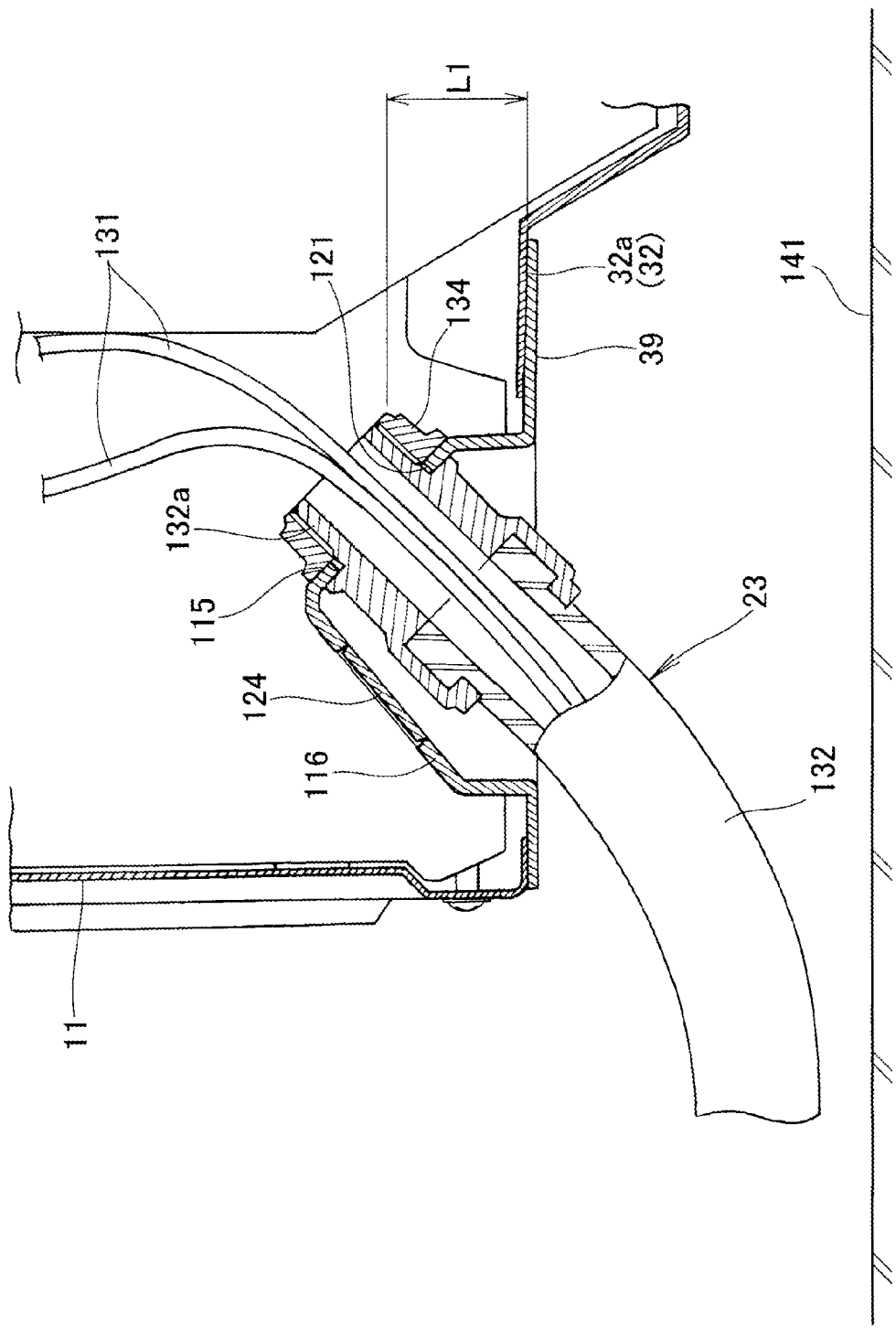
FIG. 11 is a cross-sectional view taken along line 11-11 of FIG. 10.

As shown in FIGS. 10 and 11, the grommets 122 are removed from the upper two lead-out holes 121 (FIG. 6) of the lead-out part 39, the lead-out holes 121 are opened, and the power-wiring units 23 are led out from the first inclined wall 115 of the lead-out part 39. The power-wiring unit 23 is provided with power wiring 131 and a conduit 132. The power wiring supplies electrical power generated by the electrical generator 18 shown in FIG. 2 through the power converter part 22 to the outside, and the conduit covers and thereby protects the power wiring 131.

When the power-wiring unit 23 out is to be led from the first inclined wall 115, first, the power wiring 131 is accommodated in the conduit (PF conduit (plastic flexible conduit) 132. In the state in which the power wiring 131 is accommodated in the conduit 132, a threaded-end part 132a of the conduit 132 is inserted from the lead-out hole 121 toward the interior of the cogeneration case 11. A nut 134 is threadably joined to the threaded-end part 132a that protrudes from the lead-out hole 121, whereby the conduit 132 is attached to the first inclined wall 115. The power-wiring unit 23 is thereby led from the first inclined wall 115 of the lead-out part 39 to the outside of the cogeneration case 11.

Having the power-wiring unit 23 led from the first inclined wall 115 to the outside of the cogeneration case 11 thus enables the power-wiring unit 23 to be positioned in a state of inclining to the left with respect to the cogeneration case 11. The power-wiring unit 23 can therefore be positioned close to the cogeneration case 11. The degree of freedom in placing the cogeneration apparatus 10 can thereby be increased, and the cogeneration apparatus 10 can therefore be disposed near an outer wall 141 of a house or the like.

The inclined region 112 (FIG. 8) is formed in a shape that is convex towards the interior of the cogeneration case 11 with respect to the rear panel 32 (the left-end lower part 32a), whereby the depressed space 118 is formed within the inclined region 112. The threaded-end part 132a of the conduit 132 can therefore be positioned in a state of being pushed inward by a distance L1 towards the center of the cogeneration case 11 with respect to the left-end lower part 32a. The power-wiring unit 23 can thereby be positioned even closer to the cogeneration case 11, and therefore the degree of freedom in placing the cogeneration apparatus 10 can be further increased.

Figure 12:
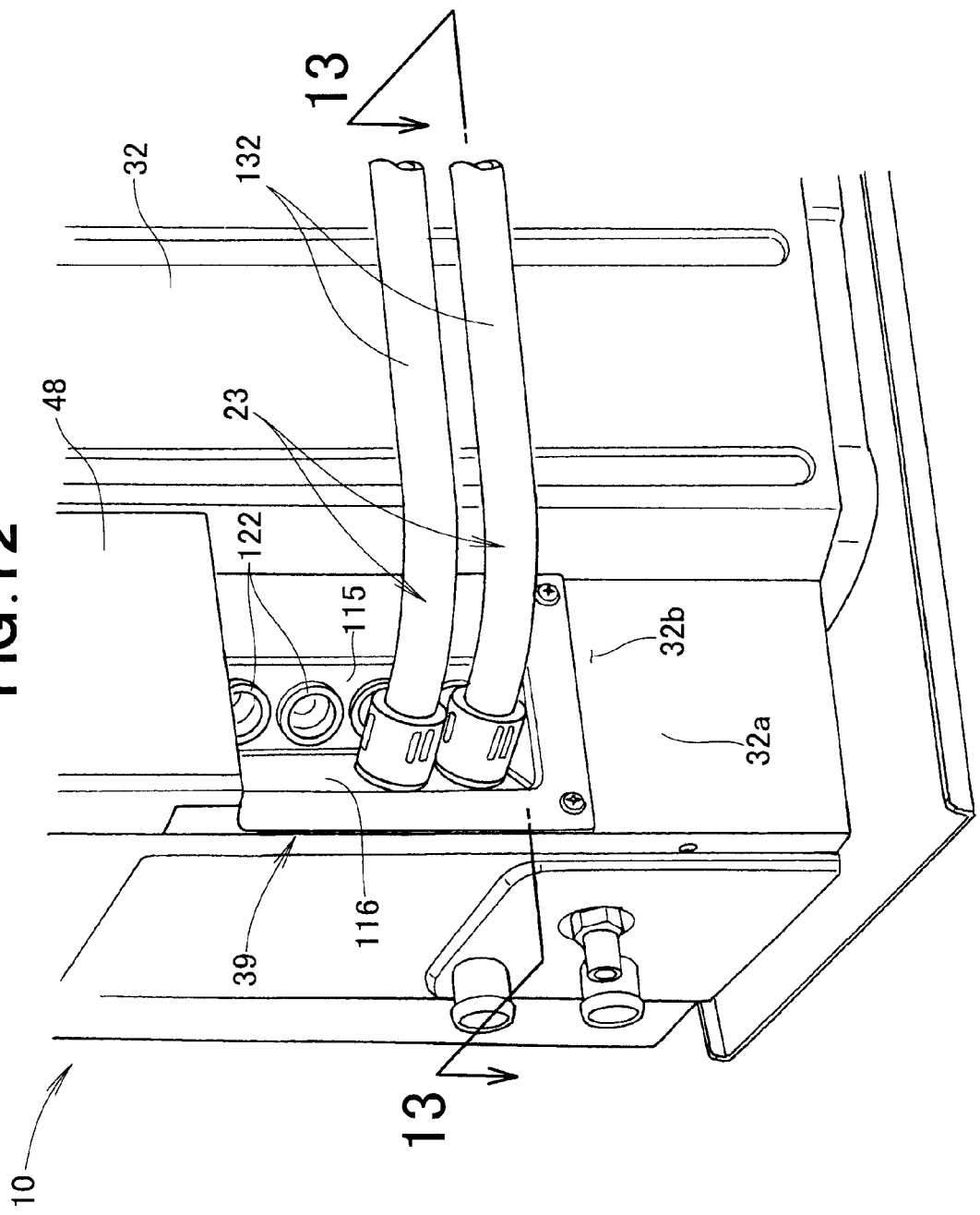
FIG. 12 is a perspective view showing the lead-out part of FIG. 6, with a power-wiring unit attached to a second inclined wall of the lead-out part.
Figure 13:
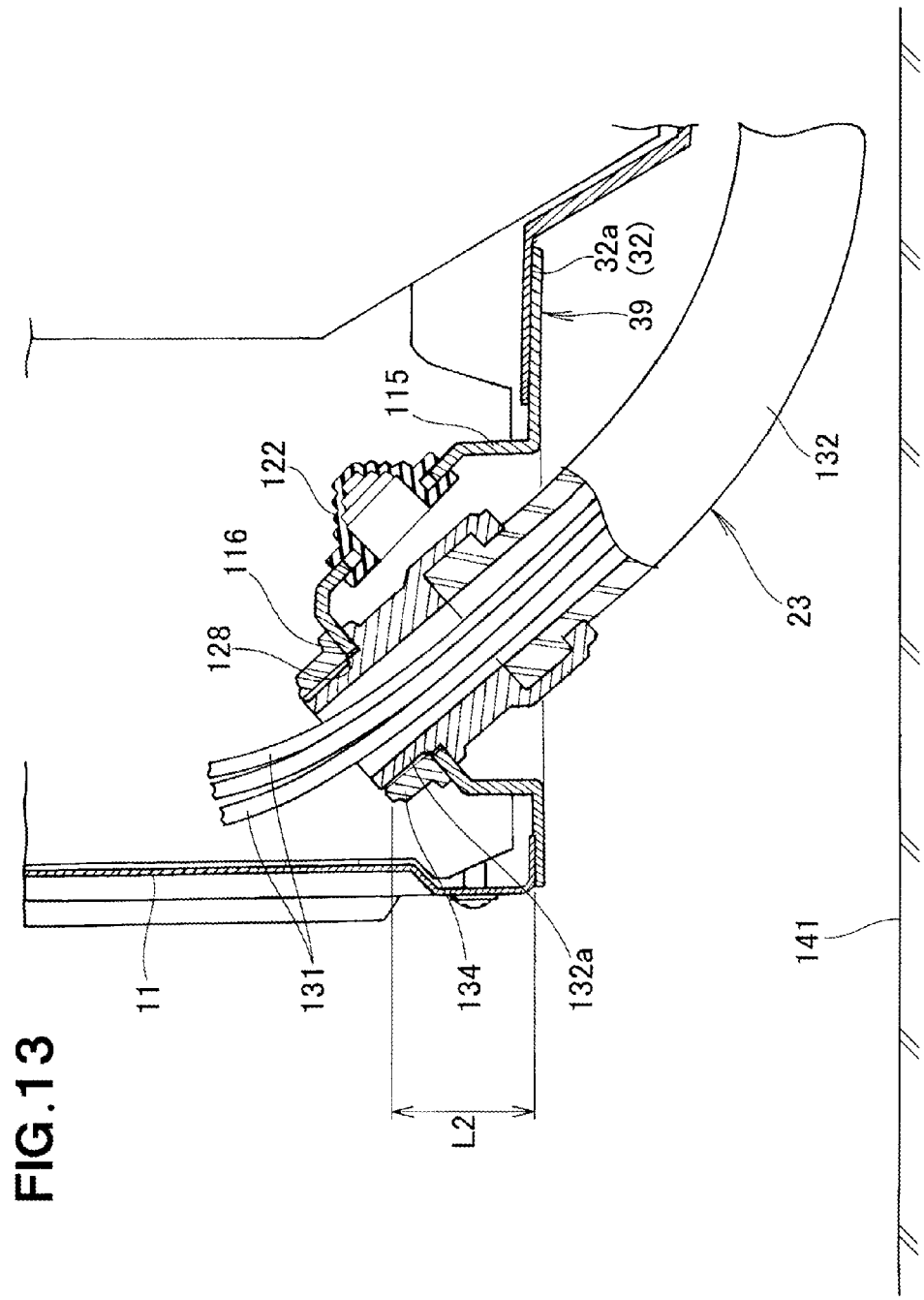
FIG. 13 is a cross-sectional view taken along line 13-13 of FIG. 12.

As shown in FIGS. 12 and 13, the blocking pieces 124 (FIG. 8) are removed from the second inclined wall 116, the lead-out holes 128 are opened in the second inclined wall 116, and the power-wiring units 23 are led out from the second inclined wall 116 of the lead-out part 39.

When the power-wiring unit 23 is to be led out from the second inclined wall 116, first, the power wiring 131 is accommodated in the conduit 132. In the state in which the power wiring 131 is accommodated in the conduit 132, a threaded-end part 132a of the conduit 132 is inserted from the lead-out hole 128 toward the interior of the cogeneration case 11. A nut 134 is threadably joined to the threaded-end part 132a that protrudes from the lead-out hole 128, whereby the conduit 132 is attached to the second inclined wall 116. The power-wiring unit 23 is thereby led from the second inclined wall 116 of the lead-out part 39 to the outside of the cogeneration case 11.

Having the power-wiring unit 23 led from the second inclined wall 116 to the outside of the cogeneration case 11 thus enables the power-wiring unit 23 to be positioned in a state of inclining to the right with respect to the cogeneration case 11. The power-wiring unit 23 can therefore be positioned close to the cogeneration case 11. The degree of freedom in placing, the cogeneration apparatus 10, can thereby be increased, and the cogeneration apparatus 10 can therefore be disposed near an outer wall 141 of a house or the like.

The inclined region 112 (FIG. 8) is formed in a shape that is convex towards the interior of the cogeneration case 11 with respect to the rear panel 32 (the left-end lower part 32a), whereby the depressed space 118 (FIG. 8) is formed within the inclined region 112. The threaded-end part 132a of the conduit 132 can therefore be positioned in a state of being pushed inward by a distance L2 towards the center of the cogeneration case 11 with respect to the left-end lower part 32a. The power-wiring unit 23 can thereby be positioned even closer to the cogeneration case 11, and therefore the degree of freedom in placing the cogeneration apparatus 10 can be further increased.

In FIGS. 12 and 13, an example was described in which the blocking pieces 124 (FIG. 8) were removed from the second inclined wall 116, and the power-wiring units 23 were inclined to the right; however, this example is not given by way of limitation. Rotating the lead-out part 39 by 180° allows the power-wiring unit 23 to be inclined to the left. In other words, rotating the lead-out part 39 by 180° so as to turn the lead-out part 39 upside-down allows the first inclined wall 115 to be positioned to the left of the second inclined wall 116. Removing the grommets 122 from the first, inclined wall 115 and providing the power-wiring units 23 to the first inclined wall 115 therefore allows the power-wiring units 23 to be inclined to the right. The power-wiring units 23 can thereby be made to incline to the right without the blocking pieces 124 having to be removed from the second inclined wall 116; therefore, usability can be improved.

Figure 14:
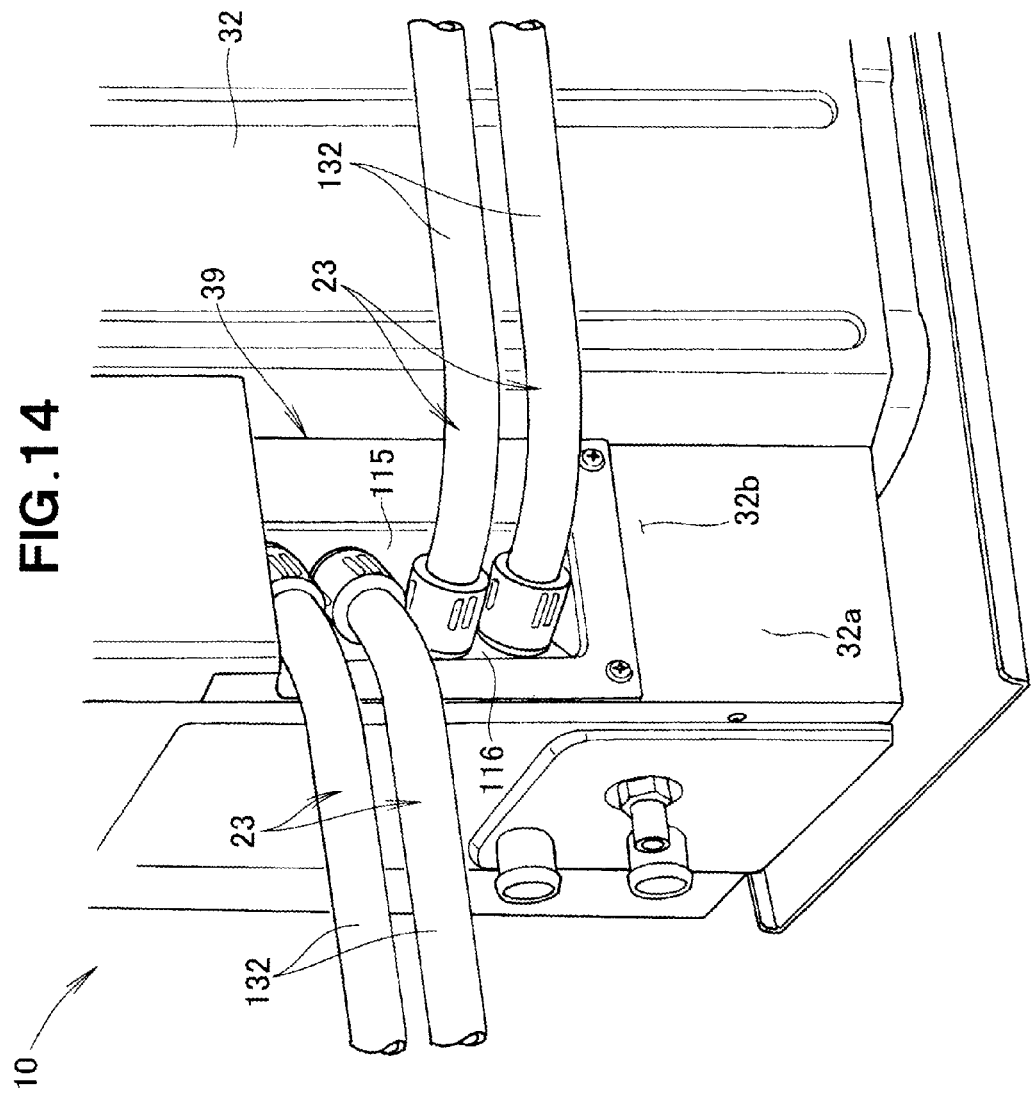
FIG. 14 is a perspective view showing the lead-out part of FIG. 6, with a power-wiring unit attached to the first inclined wall and the second inclined wall.

Depending on the usage of the cogeneration apparatus 10, the power-wiring units 23 may be positioned to the left or the right with respect to the cogeneration case 11 (FIG. 8). In such instances, the power-wiring units 23 can be led from the first inclined wall 115 to the outside of the cogeneration case 11 as shown in FIG. 14, whereby the power-wiring units 23 can be positioned inclining to the left with respect to the cogeneration case 11.

Additionally, the power-wiring units 23 are led from the second inclined wall 116 to the outside of the cogeneration case 11, whereby the power-wiring units 23 can be positioned inclining to the right with respect to the cogeneration case 11. The power-wiring units 23 can therefore be positioned close to the cogeneration case 11. The degree of freedom in placing the cogeneration apparatus 10 can thereby be increased, and the cogeneration apparatus 10 can therefore be disposed close to the outer wall 141 (FIG. 11) of a house or the like. The power-wiring units 23 can be positioned to the left or right with respect to the cogeneration case 11, and therefore the potential usages of the cogeneration apparatus 10 can be expanded.

Embodiments 2 through 5 will be described next with reference to FIGS. 15 through 19. The same notation is applied to members in Embodiments 2 through 5 that are identical or similar to those in Embodiment 1, and descriptions thereof are omitted.

Embodiment 2

Figure 15:
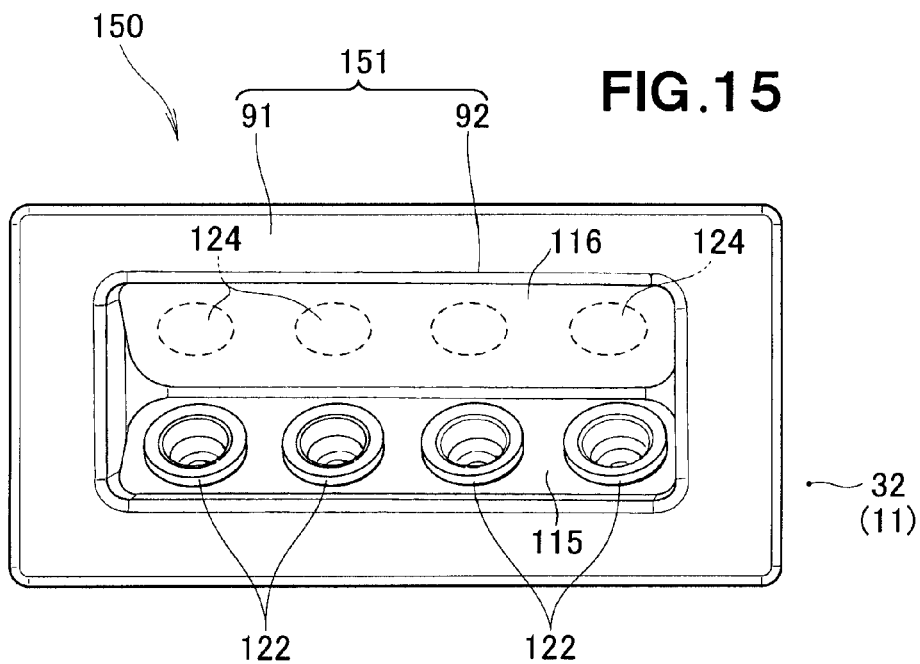
FIG. 15 is a top plan view showing a lead-out part of a cogeneration apparatus according to a second embodiment of the present invention.

As shown in FIG. 15, in a cogeneration apparatus 150 according to Embodiment 2, a lead-out part 151 is provided instead of the lead-out part 39 of Embodiment 1. The configuration is otherwise the same as the cogeneration apparatus 10 according to Embodiment 1.

The lead-out part 151 is formed substantially in a V-shape when viewing the cogeneration case 11 laterally. Forming the lead-out part 151 substantially in a V-shape when viewed laterally allows the power-wiring unit 23 (FIG. 4) to be positioned inclining up or down with respect to the rear panel 32 of the cogeneration case 11. The range of selection for the positioning direction of the power-wiring unit 23 can thereby be further expanded according to the usage of the cogeneration apparatus 150.

According to the cogeneration apparatus 150 of Embodiment 2, the same effects can be obtained as the cogeneration apparatus 10 according to Embodiment 1.

Embodiment 3

Figure 16:
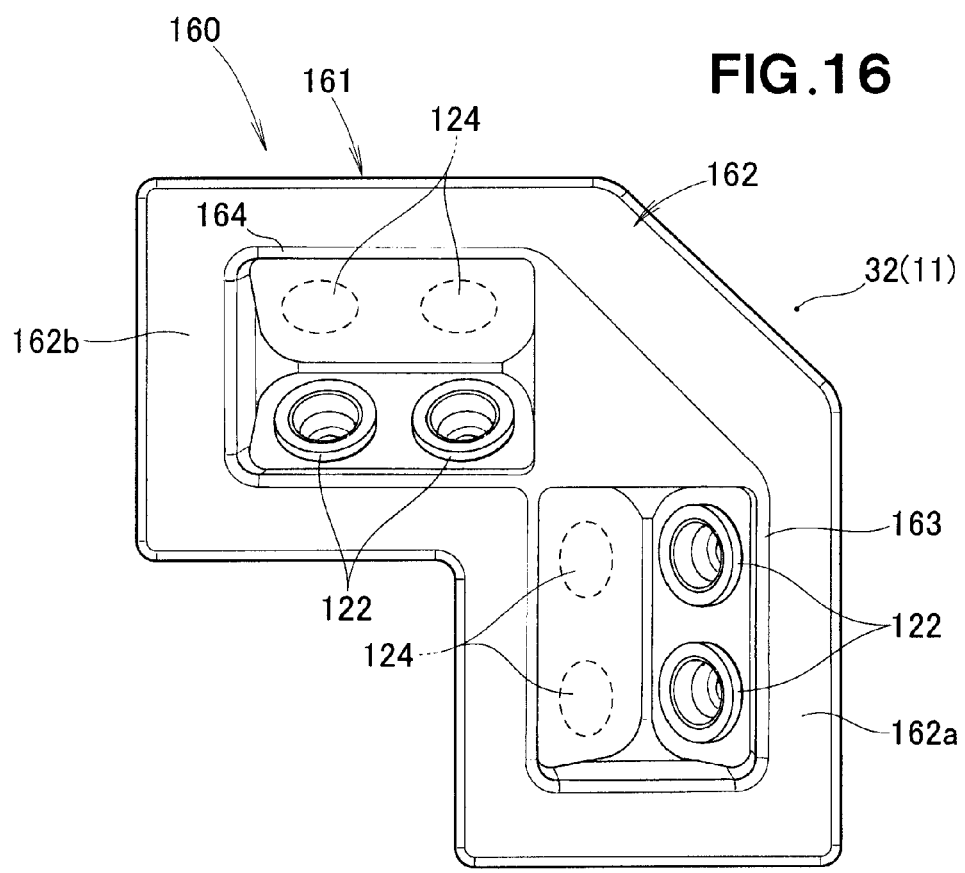
FIG. 16 is a top plan view showing a lead-out part of a cogeneration apparatus according to a third embodiment of the present invention.

As shown in FIG. 16, in a cogeneration apparatus 160 according to Embodiment 3, a lead-out part 161 is provided instead of the lead-out part 39 of Embodiment 1. The configuration is otherwise the same as the cogeneration apparatus 10 according to Embodiment 1.

The lead-out part 161 has an outer frame part 162 that is formed substantially in a dog-leg shape; a first inclined lead-out part (first lead-out part) 163 formed integrally with a lower part (vertical part) 162*a* of the outer frame part 162; and a second inclined lead-out part (second lead-out part) 164 formed integrally with an upper part (horizontal part) 162*b* of the outer frame part 162.

The first inclined lead-out part 163 is formed substantially in a V-shape when the cogeneration case 11 is viewed from above, as with the inclined lead-out part 92 of Embodiment 1. The second inclined lead-out part 164 is formed substantially in a V-shape when the cogeneration case 11 is viewed laterally, as with the inclined lead-out part 92 of Embodiment 2.

The presence of the first inclined lead-out part 163 and the second inclined lead-out part 164 on the lead-out part 161 allows the power-wiring units 23 (FIG. 4) to be positioned in a state of being inclined to the left or right or a state of being inclined up or down with respect to the rear panel 32 of the cogeneration case 11. The directions in which the power-wiring units 23 are positioned can thereby be freely selected according to the placement conditions of the cogeneration apparatus 160, and therefore the degree of freedom in placing the cogeneration apparatus 160 can be further increased.

According to the cogeneration apparatus 160 of Embodiment 3, the same effects can be obtained as the cogeneration apparatus 10 according to Embodiment 1.

(Modification)

Figure 17:
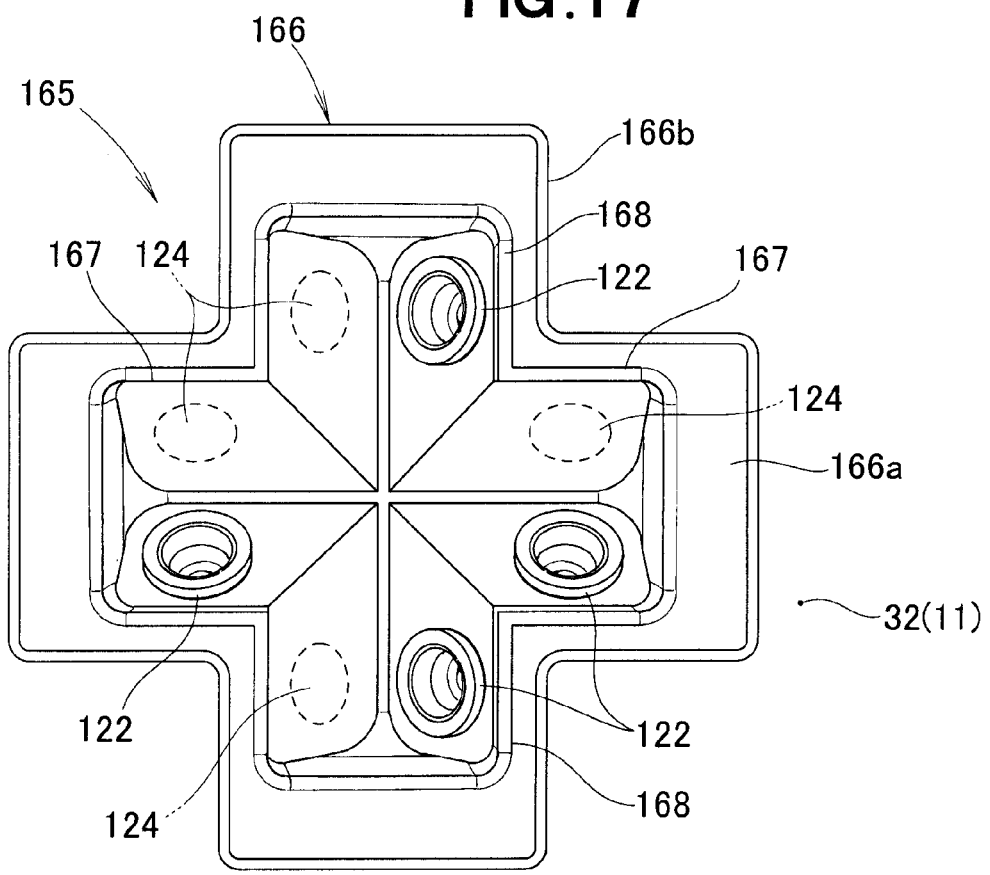
FIG. 17 is a top plan view showing a modification of the lead-out part of the cogeneration apparatus according to the third embodiment of FIG. 16.

An example was given in Embodiment 3 in which the outer frame part 162 of the lead-out part 161 was formed substantially in a dog-leg shape, and the first and second inclined lead-out parts 163, 164 were provided, but this example is not given by way of limitation; a configuration such as that of a lead-out part 165 of the modification shown in FIG. 17 is also possible.

In the lead-out part 165, an outer frame part 166 is formed in a cross shape, a pair of first inclined lead-out parts 167 is provided to a horizontal part 166*a* of the outer frame part 166, and a pair of second inclined lead-out parts 168 is provided to a vertical part 166*b* of the outer frame part 166.

According to the cogeneration apparatus 165 of the modification, the power-wiring units 23 can be positioned in a state of being inclined to the left or right or a state of being inclined up or down with respect to the rear panel 32 of the cogeneration case 11, as in Embodiment 3. The directions in which the power-wiring units 23 are positioned can thereby be freely selected according to the placement conditions of the cogeneration apparatus 165, and therefore the degree of freedom in placing the cogeneration apparatus 160 can be further increased.

Embodiment 4

Figure 18:
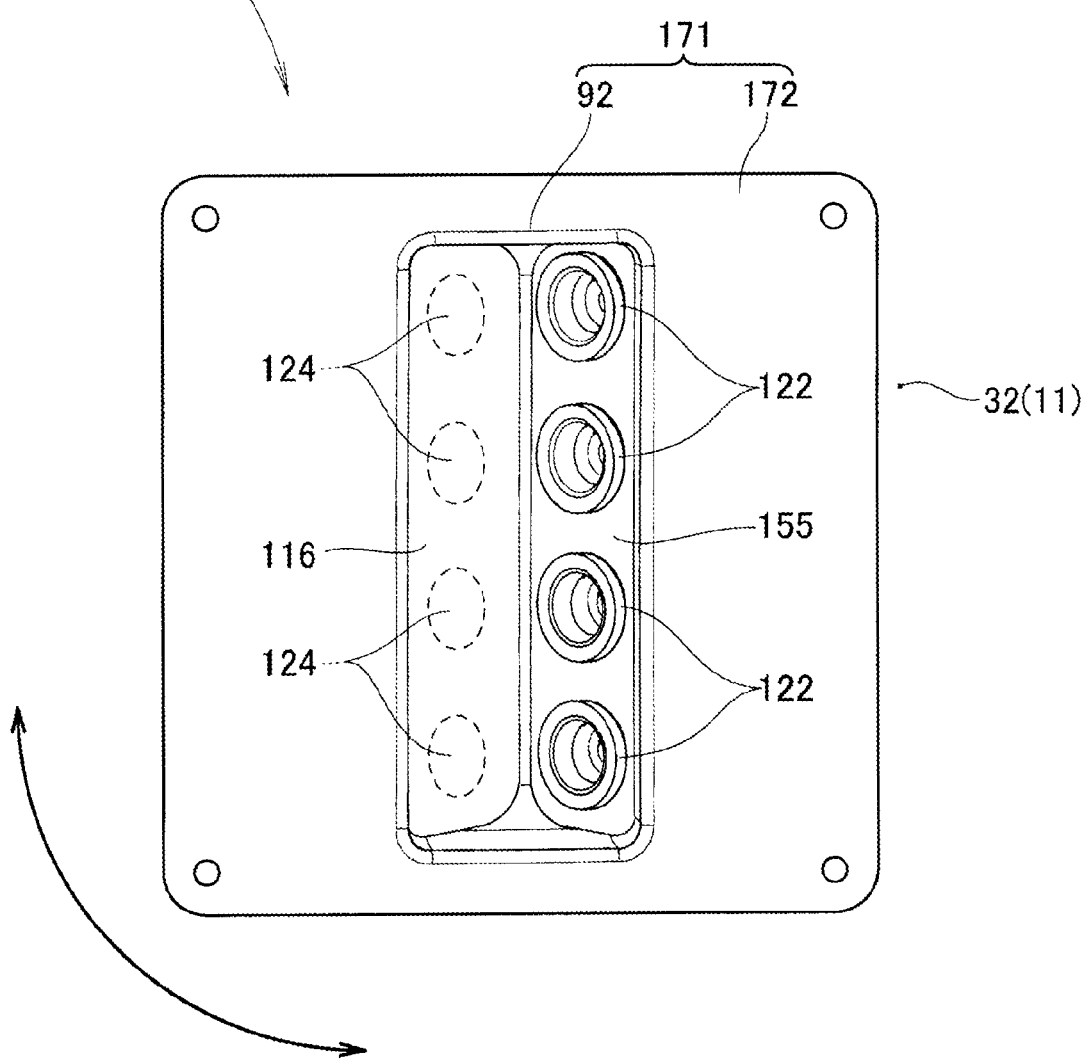
FIG. 18 is a top plan view showing a lead-out part of a cogeneration apparatus according to a fourth embodiment of the present invention.

As shown in FIG. 18, in a cogeneration apparatus 170 according to Embodiment 4, a lead-out part 171 is provided instead of the lead-out part 39 of Embodiment 1. The configuration is otherwise the same as the cogeneration apparatus 10 according to Embodiment 1.

The lead-out part 171 has an outer frame part 172, which is formed in a substantially square shape, and the inclined lead-out part 92, which is formed integrally at substantially the center of the outer frame part. The lead-out part 171 is formed to be attachable when rotated 90° in the direction of the arrow with respect to the rear panel 32.

Forming the outer frame part 172 in a substantially square shape allows the attachment aperture part 85 (FIG. 4), to which is fit (into which is fit) the inclined lead-out part 92, to be covered by the outer frame part 172 when the lead-out part 171 is rotated 90° in the direction of the arrow. The outer frame part 172 formed in a substantially square shape is given as an example in Embodiment 4, but this example is not given by way of limitation; the same effects are obtained even when the outer frame part 172 is formed substantially in a circular-plate shape.

Making the lead-out part 171 attachable when rotated by 90° with respect to the rear panel 32 allows the inclined lead-out part 92 to be rotated by 90°. A selection can therefore be made between the inclined lead-out part 92 being in a state formed substantially in a V-shape when the cogeneration case 11 is viewed from above, or being in a state formed substantially in a V-shape when the cogeneration case 11 is viewed laterally.

A selection can thereby be made between a state in which the power-wiring units 23 are positioned inclining to the left or right with respect to the rear panel 32 and a state in which the power-wiring units 23 are positioned inclining up or down with respect to the rear panel 32. The positioning directions of the power-wiring units 23 can thereby be freely selected according to the placement conditions of the cogeneration apparatus 170, and therefore the degree of freedom in placing the cogeneration apparatus 170 can be further increased.

According to the cogeneration apparatus 170 of Embodiment 4, the same effects can be obtained as the cogeneration apparatus 10 according to Embodiment 1.

Embodiment 5

Figure 19:
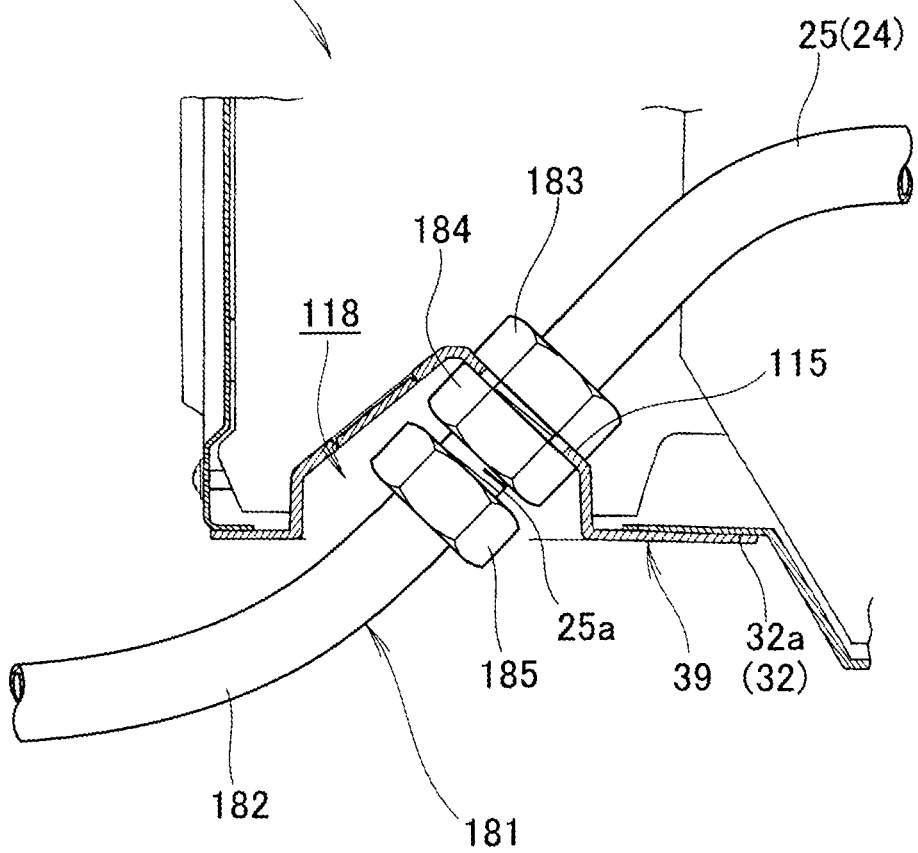
FIG. 19 is a cross-sectional view showing an example fuel-line unit provided to a lead-out part of a cogeneration apparatus according to a fifth embodiment of the present invention.

As shown in FIG. 19, in a cogeneration apparatus 180 according to Embodiment 5, a fuel-line unit (fuel line) 181 is provided to the lead-out part 39 instead of the power-wiring unit 23 of Embodiment 1. The configuration is otherwise the same as the cogeneration apparatus 10 according to Embodiment 1.

The fuel-line unit 181 is provided with the internal fuel line 24 and an external fuel line 182, which communicatingly connects the internal fuel line 24 to the fuel-gas supply source. The pipes used in the external fuel line 182 are made of, e.g., stainless steel.

When leading the fuel-line unit 181 out from the first inclined wall 115, the panel end part 25*a* of the internal fuel line 24 is first attached to the first inclined wall 115 of the lead-out part 39 using nuts 183, 184. The panel end part 25*a* protrudes from the first inclined wall 115 into the depressed space 118 in this state.

The nut 185 is threadably joined to the panel end part 25*a* that protrudes from the first inclined wall 115, whereby the external fuel line 182 is communicatingly connected to the panel end part 25*a* (i.e., the internal fuel line 24). The external fuel line 182 is communicatingly connected to the fuel-gas supply source outside the cogeneration apparatus 180.

Having the fuel-line unit 181 provided to the lead-out part 39 thus enables the fuel-line unit 181 to be favorably positioned according to the placement conditions of the cogeneration apparatus 180. The degree of freedom in placing the cogeneration apparatus 180 can therefore be increased.

In Embodiment 5, a description is given of an example of a communicating connection in which the external fuel line 182 that communicatingly connects to the internal fuel line 24 is an external fuel line 182 made of, e.g., stainless steel, but this example is not given by way of limitation; the communicating connection may also be made using a rubber hose or other line as the external fuel line.

An example was given in Embodiment 5 in which the fuel-line unit 181 was provided to the lead-out part 39, but this example is not given by way of limitation; both the fuel-line unit 181 and the power-wiring unit 23 may be provided to the lead-out part 39. The fuel-line unit 181 and the power-wiring unit 23 can thereby both be favorably positioned according to the placement conditions of the cogeneration apparatus 180, and therefore the degree of freedom in placing the cogeneration apparatus 180 can be increased.

The cogeneration apparatus according to the present invention is not limited to Embodiments 1 through 5; appropriate changes, improvements, and the like are possible. For example, the gas engine 16 was given as the motor in Embodiments 1 through 5, but this example is not given by way of limitation, and a gasoline engine or other engine can also be used.

Examples were described in Embodiments 1 through 5 in which the fuel-line unit 181 and the power-wiring unit 23 were led out from the lead-out parts 39, 151, 161, 171, but these examples are not given by way of limitation; a line for leading water to the heat exchanger 19 or a line for removing hot water from the heat exchanger 19 may also be led out. In addition, as examples of wiring other than the power-wiring unit 23, a selection made from control lines for controlling the engine 16 and the like, signal lines for conveying signals to the devices within the cogeneration case 11, communications lines for allowing communication between the devices within the cogeneration case 11, and the like may also be led out from the lead-out parts 39, 151, 161, 171.

The shapes and configurations of the cogeneration apparatuses 10, 150, 160, 170, 180, the cogeneration case 11, the engine 16, the electrical generator 18, the heat exchanger 19, the power-wiring unit 23, the internal fuel line 24, the lead-out parts 39, 151, 161, 171, the power wiring 131, the fuel-line unit 181, the external fuel line 182, and the like given in Embodiments 1 through 5 are not limited to the examples given; appropriate changes are possible.

The present invention is favorably applied to cogeneration apparatuses that can use a fuel line to supply fuel to a motor, use the motor to drive an electrical generator, and use power wiring to supply electrical power generated by the electrical generator.

Obviously, various minor changes and modifications of the present invention are possible in light of the above teaching. It is therefore to be understood that within the scope of the appended claims the invention may be practiced otherwise than as specifically described.

What is claimed is:

1. A cogeneration apparatus comprising:
    a motor;
    an electrical generator driven by the motor;
    a heat exchanger for using waste heat of the motor as a heat source;
    a housing for housing the motor, the electrical generator, and the heat exchanger;
    a fuel line for supplying fuel to the motor from outside;
    wiring for connecting devices within the housing to outside the housing so that electrical power generated by the electrical generator is supplied to the outside; and
    a plurality of blocking pieces, each of said blocking pieces having a front and rear surface, wherein
    the front surface of said blocking piece is coplanar with a front surface of the second inclined wall,
    the rear surface of said blocking piece is depressed in relation to a rear surface of the second inclined wall,
    a thickness of each of the blocking pieces is less than a thickness of the second inclined wall, and
    the housing has a lead-out part comprising first and second opposing inclined walls formed in a substantially V-shape and a plurality of vertically arranged lead-out holes formed in the first inclined wall, whereby one selected from among the fuel line and the wiring is led to the outside of the housing via the lead-out holes.

2. The apparatus according to claim 1, wherein the lead-out part is formed in a shape that is convex towards an interior of the housing with respect to a wall surface of the housing.

3. The apparatus according to claim 1, wherein the lead-out part is formed substantially in a V-shape when the housing is viewed from above.

4. The apparatus according to claim 1, wherein the lead-out part is formed substantially in a V-shape when the housing is viewed laterally.

5. The apparatus according to claim 1, wherein the lead-out part comprises: a first lead-out part formed substantially in a V-shape when the housing is viewed from above; and a second lead-out part formed substantially in a V-shape when the housing is viewed laterally.

6. The apparatus according to claim 1, wherein a selection is made between the lead-out part being: in a state formed substantially in a V-shape when the housing is viewed from above; and in a state formed substantially in a V-shape when the housing is viewed laterally.

7. The apparatus according to claim 1, wherein the first and second inclined walls are formed in a substantially rectangular shape.

8. The apparatus according to claim 1, further comprising:
    a plurality of annular grooves formed between each of the blocking pieces and the second inclined wall; and
    a break region formed between a bottom surface of each of the annular grooves and the front surface of the second inclined wall, wherein
    a thickness of the break region is less than the thickness of each of the blocking pieces.

* * * * *